US012648314B2

(12) United States Patent
Ju et al.

(10) Patent No.: US 12,648,314 B2
(45) Date of Patent: Jun. 2, 2026

(54) DISPLAY APPARATUS INCLUDING GROOVE SURROUNDING SUB-PIXEL AREA AND CONNECTION LINE OVERLAPPING THE GROVE

(71) Applicant: SAMSUNG DISPLAY CO., LTD., Yongin-si (KR)

(72) Inventors: Jinho Ju, Yongin-si (KR); Minjeong Oh, Yongin-si (KR); Kijune Lee, Yongin-si (KR); Sungeun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 368 days.

(21) Appl. No.: 18/199,805

(22) Filed: May 19, 2023

(65) Prior Publication Data

US 2024/0057412 A1 Feb. 15, 2024

(30) Foreign Application Priority Data

Aug. 10, 2022 (KR) ........................ 10-2022-0099993

(51) Int. Cl.
H01L 29/08 (2006.01)
H10K 59/121 (2023.01)
H10K 59/131 (2023.01)

(52) U.S. Cl.
CPC ....... H10K 59/131 (2023.02); H10K 59/1213 (2023.02)

(58) Field of Classification Search
CPC ........................ H10K 59/131; H10K 59/1213

USPC .......................................................... 257/40
See application file for complete search history.

(56) References Cited

U.S. PATENT DOCUMENTS

| | | | |
|---|---|---|---|
| 10,868,096 B2 | 12/2020 | Park et al. | |
| 2018/0151599 A1* | 5/2018 | Cho ..................... | H10K 59/131 |
| 2021/0134931 A1 | 5/2021 | Kim et al. | |
| 2022/0069021 A1 | 3/2022 | Kim et al. | |
| 2022/0077274 A1 | 3/2022 | Park et al. | |
| 2022/0309974 A1 | 9/2022 | Park et al. | |

FOREIGN PATENT DOCUMENTS

| | | | | |
|---|---|---|---|---|
| CN | 114695460 A | * | 7/2022 | .......... H10K 59/878 |
| KR | 1020190055868 A | | 5/2019 | |
| KR | 1020190104091 A | | 9/2019 | |
| KR | 1020210008977 A | | 1/2021 | |
| KR | 1020210053610 A | | 6/2021 | |
| KR | 1020220030433 A | | 3/2022 | |

* cited by examiner

*Primary Examiner* — Phuc T Dang
(74) *Attorney, Agent, or Firm* — CANTOR COLBURN LLP

(57) ABSTRACT

A display apparatus includes: a substrate including a sub-pixel area, a lower conductive layer disposed on the substrate and including a connection line, a first semiconductor layer disposed on the lower conductive layer, a gate conductive layer disposed on the lower conductive layer and connected to the connection line, an inorganic insulating layer disposed on the substrate and defining a groove therein surrounding the sub-pixel area, and a connection electrode layer disposed on the inorganic insulating layer and connected to the gate conductive layer, where the connection line is disposed to cross the groove in a plan view.

19 Claims, 15 Drawing Sheets

DISPLAY APPARATUS INCLUDING GROOVE SURROUNDING SUB-PIXEL AREA AND CONNECTION LINE OVERLAPPING THE GROVE

This application claims priority to Korean Patent Application No. 10-2022-0099993, filed on Aug. 10, 2022, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

A display apparatus visually displays data. The display apparatus is used as a display unit of miniaturized products such as mobile phones, and used as a display unit of large-scale products such as televisions.

The display apparatus may include a plurality of sub-pixels configured to receive electrical signals and emit light to display images to the outside. Each of the plurality of sub-pixels may include a display element.

As the purposes of the display apparatus have diversified, various designs for improving the quality of the display apparatus such as preventing defects due to external impacts, or reducing process operations, have been tried.

SUMMARY

One or more embodiments include a display apparatus having a high resolution, which is flexible and robust against external impact. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes: a substrate including a sub-pixel area, a lower conductive layer disposed on the substrate and including a connection line, a first semiconductor layer disposed on the lower conductive layer, a gate conductive layer disposed on the lower conductive layer and connected to the connection line, an inorganic insulating layer disposed on the substrate and defining a groove therein surrounding the sub-pixel area, and a connection electrode layer disposed on the inorganic insulating layer and connected to the gate conductive layer, where the connection line is arranged to cross the groove in a plan view.

The sub-pixel area may include a first sub-pixel area and a second sub-pixel area each surrounded by the groove, and the connection line may overlap the first sub-pixel area and the second sub-pixel area in the plan view.

The display apparatus may further include a second semiconductor layer disposed on the first semiconductor layer, where the gate conductive layer may include a first gate conductive layer, a second gate conductive layer, and a third gate conductive layer, the first gate conductive layer and the second gate conductive layer may be disposed between the first semiconductive layer and the second semiconductive layer, and the third gate conductive layer may be disposed on the second semiconductor layer.

The connection line may be provided in plurality, the plurality of connection lines may include a first connection line, a second connection line, and a third connection line, the first connection line may be electrically connected to the first gate conductive layer, the second connection line may be electrically connected to the second gate conductive layer, and the third connection line may be electrically connected to the third gate conductive layer.

The plurality of connection lines may further include a fourth connection line electrically connected to the first semiconductor layer.

The first connection line, the second connection line, and the third connection line may extend in a first direction, and the fourth connection line may extend in a second direction crossing the first direction.

The first semiconductor layer may include a silicon semiconductor, and the second semiconductor layer may include an oxide semiconductor.

The groove may expose a portion of the lower conductive layer.

The display apparatus may further include an organic insulating layer covering the inorganic insulating layer and the connection electrode layer, where the organic insulating layer may be disposed to fill the groove.

The display apparatus may further include a pixel electrode disposed on the organic insulating layer, an intermediate layer disposed on the pixel electrode, and an opposite electrode covering the intermediate layer.

According to one or more embodiments, a display apparatus includes: a substrate including a sub-pixel area, a lower conductive layer disposed on the substrate, a first semiconductor layer disposed on the lower conductive layer and including a silicon semiconductor, a first gate conductive layer disposed on the first semiconductor layer, an inorganic insulating layer disposed on the substrate and defining a groove therein surrounding the sub-pixel area, and a first connection electrode disposed on the inorganic insulating layer and connecting the lower conductive layer to the first gate conductive layer through a contact hole.

The lower conductive layer may include a plurality of connection lines overlapping the groove in a plan view.

The display apparatus may further include a second gate conductive layer disposed on the first gate conductive layer, a third gate conductive layer disposed on the second gate conductive layer, and a second semiconductor layer disposed between the second gate conductive layer and the third gate conductive layer and including an oxide semiconductor, where the plurality of connection lines may include a first connection line, a second connection line, and a third connection line, the first connection line may be electrically connected to the first gate conductive layer, the second connection line may be electrically connected to the second gate conductive layer, and the third connection line may be electrically connected to the third gate conductive layer.

The display apparatus may further include a second connection electrode disposed on the inorganic insulating layer and connecting the second gate conductive layer to the second connection line through a contact hole, and a third connection electrode disposed on the inorganic insulating layer and connecting the third gate conductive layer to the third connection line through a contact hole.

The plurality of connection lines may further include a fourth connection line electrically connected to the first semiconductor layer, and the display apparatus may further include a fourth connection electrode disposed on the inorganic insulating layer and connecting the first semiconductor layer to the fourth connection line through a contact hole.

The plurality of connection lines may be arranged to cross the groove in the plan view.

The sub-pixel area may include a first sub-pixel area and a second sub-pixel area, and the groove may surround each of the first sub-pixel area and the second sub-pixel area and expose a portion of the lower conductive layer in the plan view.

The display apparatus may further include an organic insulating layer covering the inorganic insulating layer and filling the groove, an upper connection electrode layer disposed on the organic insulating layer, and an upper organic insulating layer covering the upper connection electrode layer.

The display apparatus may further include a pixel electrode disposed on the upper organic insulating layer and connected to the upper connection electrode layer.

The display apparatus may further include an intermediate layer disposed on the pixel electrode, and an opposite electrode covering the intermediate layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
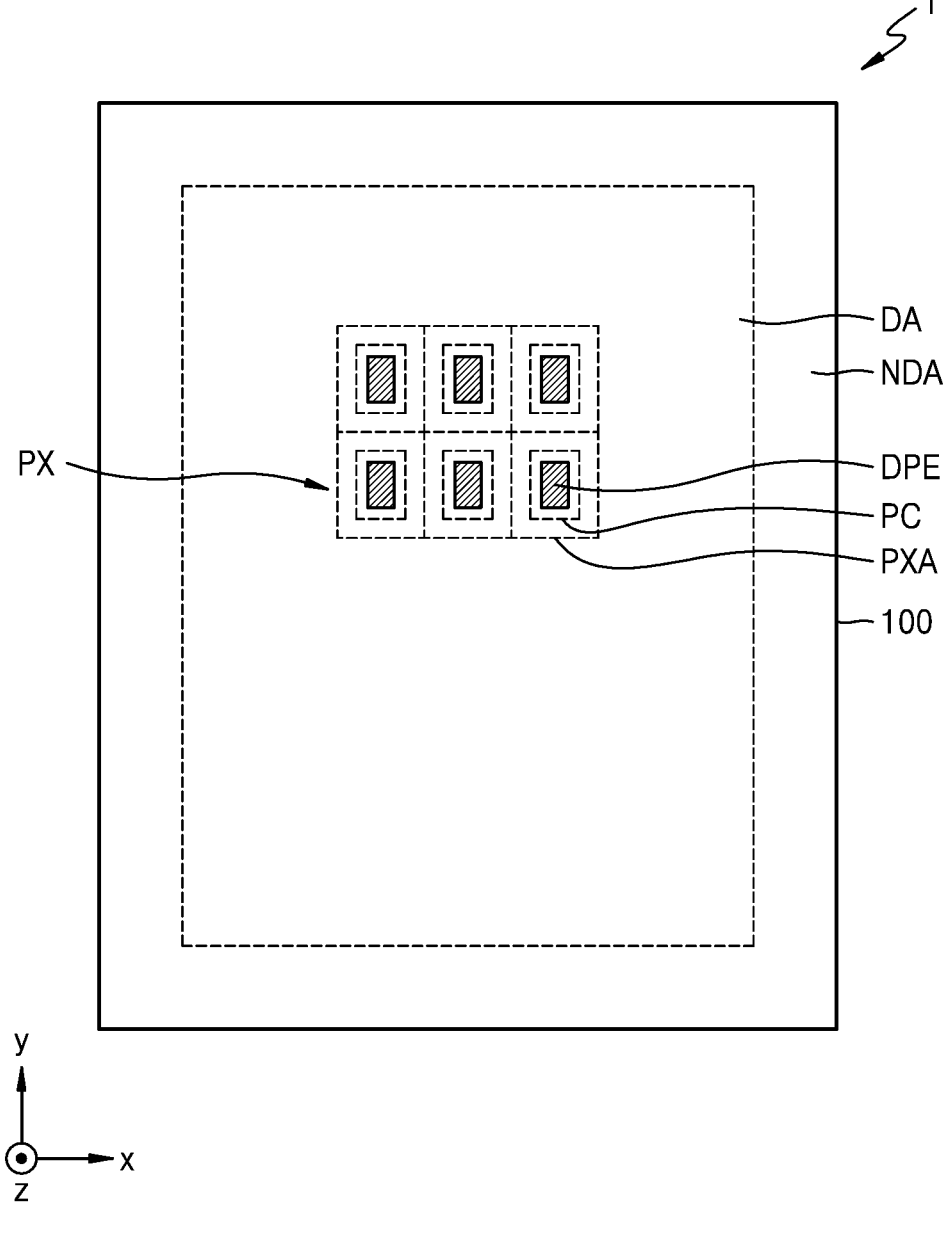
FIG. 1 is a schematic plan view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in an order different from the described order. As an example, two processes successively described may be performed substantially simultaneously or performed in the opposite order.

It will be understood that when a layer, region, or component is referred to as being "connected" to another layer, region, or component, it may be "directly connected" to the other layer, region, or component or may be "indirectly connected" to the other layer, region, or component with another layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to the other layer, region, or component with another layer, region, or component interposed therebetween.

The display apparatus displays images and may be a portable mobile apparatus, such as a game console, a multimedia apparatus, and an ultraminiature personal computer ("PC"). The display apparatus may include liquid crystal displays, electrophoretic displays, organic light-emitting displays, inorganic light-emitting displays, field emission displays, surface-conduction electron-emitter displays, quantum dot displays, plasma displays, cathode ray displays, and the like. Hereinafter, though an organic light-emitting display apparatus is described as an example of the display apparatus according to an embodiment, the various types of display apparatus described above may be used in embodiments.

FIG. 1 is a schematic plan view of a display apparatus 1 according to an embodiment. Here, the "plan view" is a view in a third direction z (i.e., thickness direction of the display apparatus 1).

Referring to FIG. 1, the display apparatus 1 may include a substrate 100, a pixel circuit PC, and a display element DPE. The substrate 100 may include a display area DA and a non-display area NDA. The display apparatus 1 may be configured to display images in the display area DA. The non-display area NDA may be a region in which images are not displayed.

The display area DA may include a sub-pixel area PXA. In an embodiment, the display area DA may include a plurality of sub-pixel areas PXA. The plurality of sub-pixel areas PXA may be arranged in a first direction and a second direction crossing the first direction. The first direction and the second direction may be perpendicular to each other, may form an obtuse angle, or form an acute angle. Hereinafter, the case where the first direction and the second direction are perpendicular to each other is mainly described in detail. As an example, the first direction may be an x direction or a −x direction in FIG. 1. The second direction may be a y direction or a −y direction in FIG. 1.

The pixel circuit PC may be configured to transfer electrical signals to the display element DPE and control the display element DPE. In an embodiment, the pixel circuit PC may be arranged in the sub-pixel area PXA. In an embodiment, the plurality of pixel circuits PC may be arranged in the plurality of sub-pixel areas PXA, respectively. In this case, the sub-pixel area PXA may be defined as a region in which the pixel circuit PC is arranged. In an embodiment, the pixel circuit PC may include at least one thin-film transistor and at least one storage capacitor.

The display element DPE may be configured to emit light and arranged in the sub-pixel area PXA. In an embodiment, the plurality of display elements DPE may be arranged in the plurality of sub-pixel areas PXA, respectively. That is, the sub-pixel area PXA may be defined as a region in which the display element DPE is arranged.

The display element DPE may be configured to receive electrical signals from the pixel circuit PC and emit light according to the electrical signals. In this case, an emission area of the display element DPE may define a sub-pixel PX. Because the plurality of display elements DPE may be configured to emit light, the display apparatus 1 may be configured to display images in the display area DA.

The display element DPE may be an organic light-emitting diode including an organic emission layer. Alternatively, the display element DPE may be a light-emitting diode LED. The size of the light-emitting diode LED may be microscale or nanoscale. As an example, the light-emitting diode may be a micro light-emitting diode. Alternatively, the light-emitting diode may be a nanorod light-emitting diode. The nanorod light-emitting diode may include gallium nitride (GaN). In an embodiment, a color-converting layer may be disposed on the nanorod light-emitting diode. The color-converting layer may include quantum dots. Alternatively, the display element DPE may be a quantum-dot light-emitting diode including a quantum-dot emission layer. Alternatively, the display element DPE may be an inorganic light-emitting diode including an inorganic semiconductor. Hereinafter, the case where the display element DPE is an organic light-emitting diode is mainly described in detail.

Figure 2:
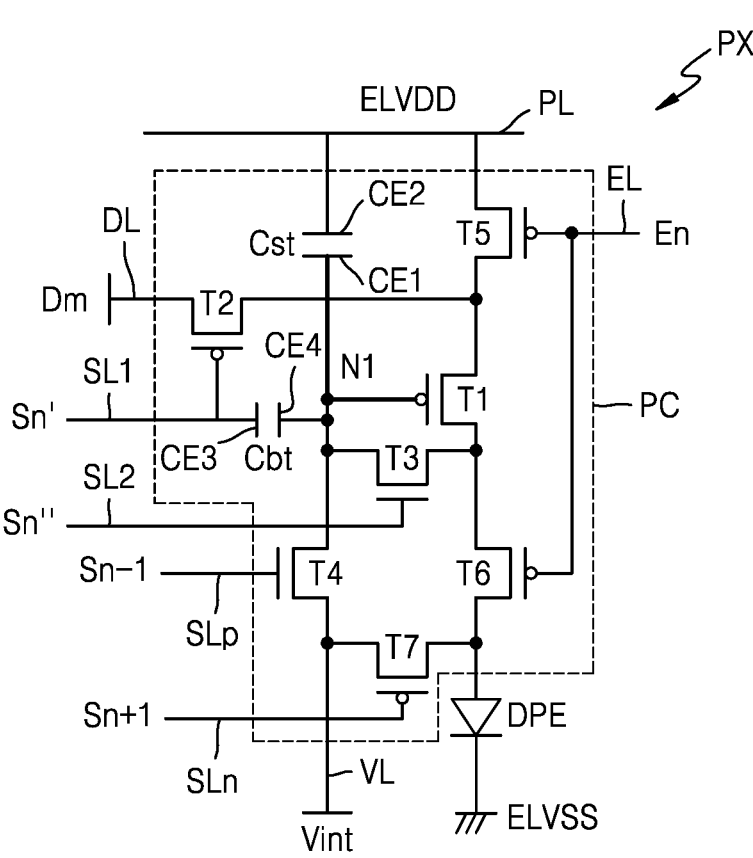
FIG. 2 is an equivalent circuit diagram of a sub-pixel of a display apparatus according to an embodiment.

FIG. 2 is an equivalent circuit diagram of a sub-pixel PX of the display apparatus 1 according to an embodiment.

Referring to FIG. 2, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, a storage capacitor Cst, and a boost capacitor Cbt.

Though it is shown in FIG. 2 that signal lines SL1, SL2, SLp, SLn, EL, and DL, an initialization voltage line VL, and a driving voltage line PL are provided to each pixel circuit PC, at least one of the signal lines SL1, SL2, SLp, SLn, EL, and DL, and/or the initialization voltage line VL may be shared by adjacent pixel circuits in another embodiment.

Some of the plurality of thin-film transistors T1, T2, T3, T4, T5, T6, and T7 may be n-channel metal oxide semiconductor ("NMOS") field-effect transistors (n-channel "MOS-FETs"), and the rest of the plurality of thin-film transistors may be p-channel metal oxide semiconductor ("PMOS") field-effect transistors (p-channel MOSFETs).

In an embodiment, among the plurality of thin-film transistors T1, T2, T3, T4, T5, T6, and T7, the compensation thin-film transistor T3 and the first initialization thin-film transistor T4 may be n-channel MOSFETs, and the rest may be p-channel MOSFETs.

In another embodiment, among the plurality of thin-film transistors T1, T2, T3, T4, T5, T6, and T7, the compensation thin-film transistor T3, the first initialization thin-film transistor T4, and the second initialization thin-film transistor T7 may be n-channel MOSFETs, and the rest may be p-channel MOSFETs. Alternatively, among the plurality of thin-film transistors T1, T2, T3, T4, T5, T6, and T7, only one thin-film transistor may be an n-channel MOSFET, and the rest may be p-channel MOSFETs. Alternatively, all of the plurality of thin-film transistors T1, T2, T3, T4, T5, T6, and T7 may be n-channel MOSFETs.

The signal lines may include the first scan line SL1, the second scan line SL2, the previous scan line SLp, the emission control line EL, the next scan line SLn, and the data line DL, where the first scan line SL1 is configured to transfer a first scan signal Sn', the second scan line SL2 is configured to transfer a second scan signal Sn", the previous scan line SLp is configured to transfer a previous scan signal Sn−1 to the first initialization thin-film transistor T4, the emission control line EL is configured to transfer an emission control signal En to the operation control thin-film transistor T5 and the emission control thin-film transistor T6, the next scan line SLn is configured to transfer a next scan signal Sn+1 to the second initialization thin-film transistor T7, and the data line DL is configured to transfer a data signal Dm.

The driving voltage line PL may be configured to transfer a first power voltage ELVDD to the driving thin-film transistor T1, and the initialization voltage line VL may be configured to transfer an initialization voltage Vint initializing the driving thin-film transistor T1 and a pixel electrode.

A driving gate electrode of the driving thin-film transistor T1 may be electrically connected to a first electrode CE1 of the storage capacitor Cst, a driving source electrode of the driving thin-film transistor T1 may be electrically connected to the driving voltage line PL through the operation control thin-film transistor T5, and a drain electrode of the driving thin-film transistor T1 may be electrically connected to the pixel electrode of the display element DPE through the emission control thin-film transistor T6. The driving thin-film transistor T1 may be configured to receive a data signal Dm and supply a driving current to the display element DPE according to a switching operation of the switching thin-film transistor T2.

A switching gate electrode of the switching thin-film transistor T2 may be electrically connected to the first scan line SL1. A switching source electrode of the switching thin-film transistor T2 may be electrically connected to the data line DL. A switching drain electrode of the switching thin-film transistor T2 may be electrically connected to the driving source electrode of the driving thin-film transistor T1, and electrically connected to the driving voltage line PL through the operation control thin-film transistor T5. The switching thin-film transistor T2 may be turned on according to a first scan signal Sn' transferred through the first scan line SL1 and may perform a switching operation of transferring a data signal Dm to the driving source electrode of the driving thin-film transistor T1, where the data signal Dm is transferred through the data line DL.

A compensation gate electrode of the compensation thin-film transistor T3 may be electrically connected to the second scan line SL2. A compensation drain electrode of the compensation thin-film transistor T3 may be electrically connected to the driving drain electrode of the driving thin-film transistor T1 and connected to the pixel electrode of the display element DPE through the emission control thin-film transistor T6. A compensation source electrode of the compensation thin-film transistor T3 may be electrically connected to the first electrode CE1 of the storage capacitor Cst and the driving gate electrode of the driving thin-film transistor T1. In addition, the compensation source electrode of the compensation thin-film transistor T3 may be electrically connected to a first initialization drain electrode of the first initialization thin-film transistor T4.

The compensation thin-film transistor T3 may be turned on according to a second scan signal Sn" and may diode-connect the driving thin-film transistor T1 by electrically connecting the driving gate electrode to the driving drain electrode of the driving thin-film transistor T1, where the second scan signal Sn" is transferred through the second scan line SL2.

A first initialization gate electrode of the first initialization thin-film transistor T4 may be electrically connected to the previous scan line SLp. A first initialization source electrode of the first initialization thin-film transistor T4 may be electrically connected to a second initialization source electrode of the second initialization thin-film transistor T7 and the initialization voltage line VL. A first initialization drain electrode of the first initialization thin-film transistor T4 may be electrically connected to the first electrode CE1 of the storage capacitor Cst, the compensation source electrode of the compensation thin-film transistor T3, and the driving gate electrode of the driving thin-film transistor T1. That is, the first initialization thin-film transistor T4 may be turned on according to a previous scan signal Sn−1 received through the previous scan line SLp and may perform an initialization operation of initializing the voltage of the driving gate electrode of the driving thin-film transistor T1 by transferring the initialization voltage Vint to the driving gate electrode of the driving thin-film transistor T1.

An operation control gate electrode of the operation control thin-film transistor T5 may be electrically connected to the emission control line EL. An operation control source electrode of the operation control thin-film transistor T5 may be electrically connected to the driving voltage line PL. An operation control drain electrode of the operation control thin-film transistor T5 may be electrically connected to the driving source electrode of the driving thin-film transistor T1 and the switching drain electrode of the switching thin-film transistor T2.

An emission control gate electrode of the emission control thin-film transistor T6 may be electrically connected to the emission control line EL. An emission control source electrode of the emission control thin-film transistor T6 may be electrically connected to the driving drain electrode of the driving thin-film transistor T1 and the compensation drain electrode of the compensation thin-film transistor T3. An emission control drain electrode of the emission control thin-film transistor T6 may be electrically connected to a second initialization drain electrode of the second initialization thin-film transistor T7 and the pixel electrode of the display element DPE.

The operation control thin-film transistor T5 and emission control thin-film transistor T6 may be simultaneously turned on according to an emission control signal En transferred through the emission control line EL, the first power voltage ELVDD is transferred to the display element DPE, and the driving current flows through the organic light-emitting diode OLED.

A second initialization gate electrode G7 of the second initialization thin-film transistor T7 may be electrically connected to the next scan line SLn. A second initialization source electrode of the second initialization thin-film transistor T7 may be electrically connected to the emission control drain electrode of the emission control thin-film transistor T6 and the pixel electrode of the organic light-emitting diode OLED. A second initialization drain electrode of the second initialization thin-film transistor T7 may be electrically connected to the first initialization source electrode of the first initialization thin-film transistor T4 and the initialization voltage line VL. The second initialization thin-film transistor T7 may be turned on according to a next scan signal Sn+1 transferred through the next scan line SLn to initialize the pixel electrode of the display element DPE.

Figure 8:
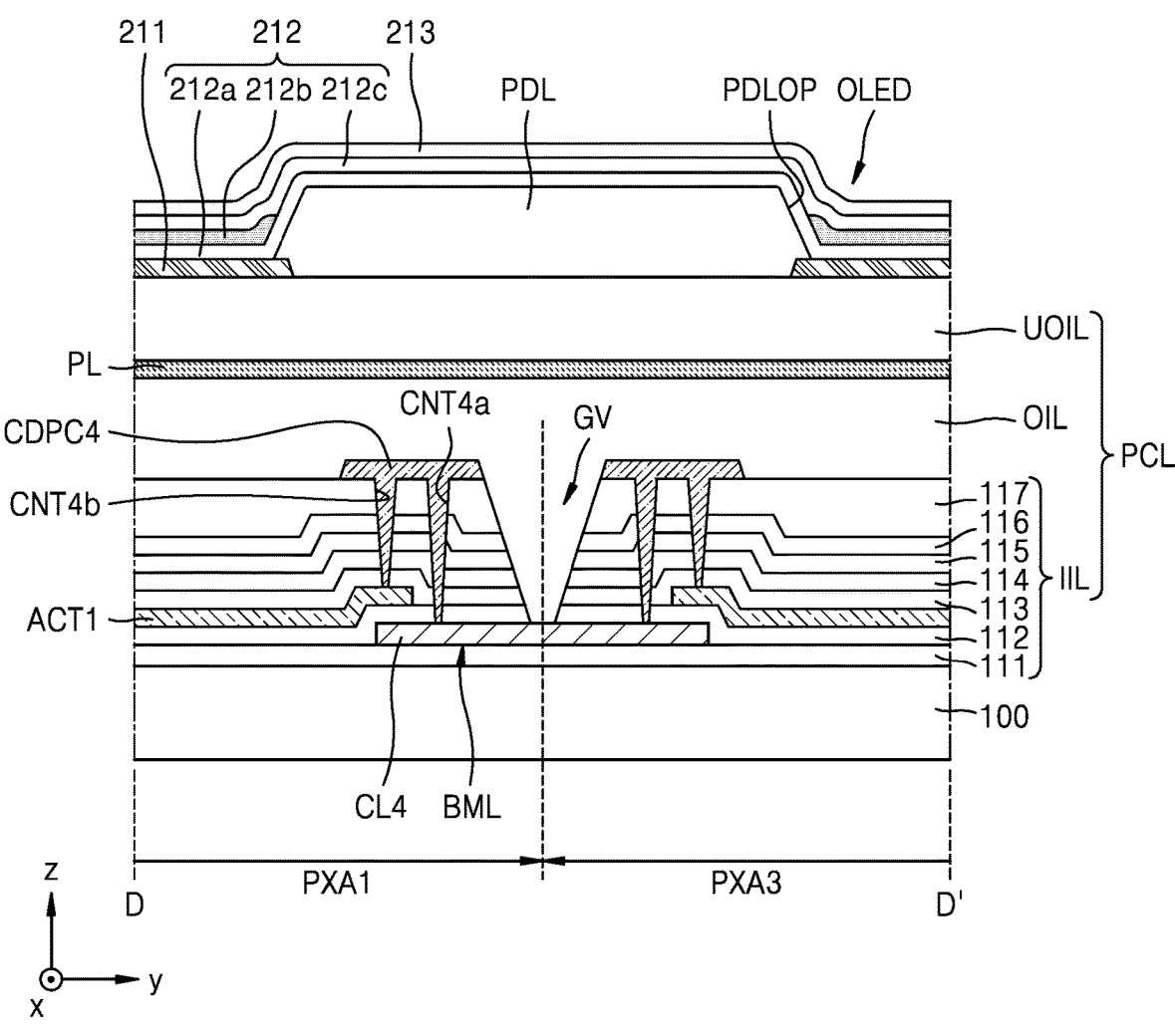

As shown in FIG. 8, the second initialization thin-film transistor T7 may be connected to the next scan line SLn. In another embodiment, the second initialization thin-film transistor T7 may be connected to the emission control line EL and driven according to an emission control signal En. The positions of source electrodes and drain electrodes in FIG. 8 may be exchanged depending on the type (a p-type or an n-type) of the transistor.

The storage capacitor Cst may include the first electrode CE1 and a second electrode CE2. The first electrode CE1 of the storage capacitor Cst may be electrically connected to the driving gate electrode of the driving thin-film transistor T1, and the second electrode CE2 of the storage capacitor Cst may be electrically connected to the driving voltage line PL. The storage capacitor Cst may be configured to store charge corresponding to a difference between a voltage of the driving gate electrode of the driving thin-film transistor T1 and the first power voltage ELVDD.

The boost capacitor Cbt includes a third electrode CE3 and a fourth electrode CE4. The third electrode CE3 may be electrically connected to the switching gate electrode of the switching thin-film transistor T2 and the first scan line SL1, and the fourth electrode CE4 may be electrically connected to the compensation source electrode of the compensation thin-film transistor T3 and a node connection line. When a first scan signal Sn' supplied through the first scan line SL1 is a voltage which turns off the switching thin-film transistor T2, the boost capacitor Cbt may raise the voltage of a first node N1. As described above, when the voltage of the first node N1 is raised, a black grayscale may be clearly expressed.

The first node N1 may be a region in which the driving gate electrode of the driving thin-film transistor T1, the source electrode of the compensation thin-film transistor T3, the drain electrode of the first initialization thin-film transistor T4, and the fourth electrode CE4 of the boost capacitor Cbt are electrically connected through the node connection line.

In an embodiment, at least one of the plurality of thin-film transistors T1, T2, T3, T4, T5, T6, and T7 may include a semiconductor layer including oxide, and the rest may include a semiconductor layer including silicon.

Specifically, the driving thin-film transistor directly influencing the brightness of the display apparatus may be configured to include a semiconductor layer including polycrystalline silicon having high reliability, and thus, a high-resolution display apparatus may be implemented through this configuration.

Because the oxide semiconductor has a high carrier mobility and a low leakage current, a voltage drop may not be large even though a driving time is long. That is, because a color change of an image according to a voltage drop is not large even while the display apparatus is driven in low frequencies, the display apparatus may be driven in low frequencies.

Because the oxide semiconductor has an advantage of a low leakage current, at least one of the compensation thin-film transistor T3, the first initialization thin-film transistor T4, and the second initialization thin-film transistor T7 connected to the driving gate electrode of the driving thin-film transistor T1 may include an oxide semiconductor, and thus, a leakage current that may flow to the driving gate electrode may be prevented, and simultaneously, power consumption may be reduced.

Figure 3:
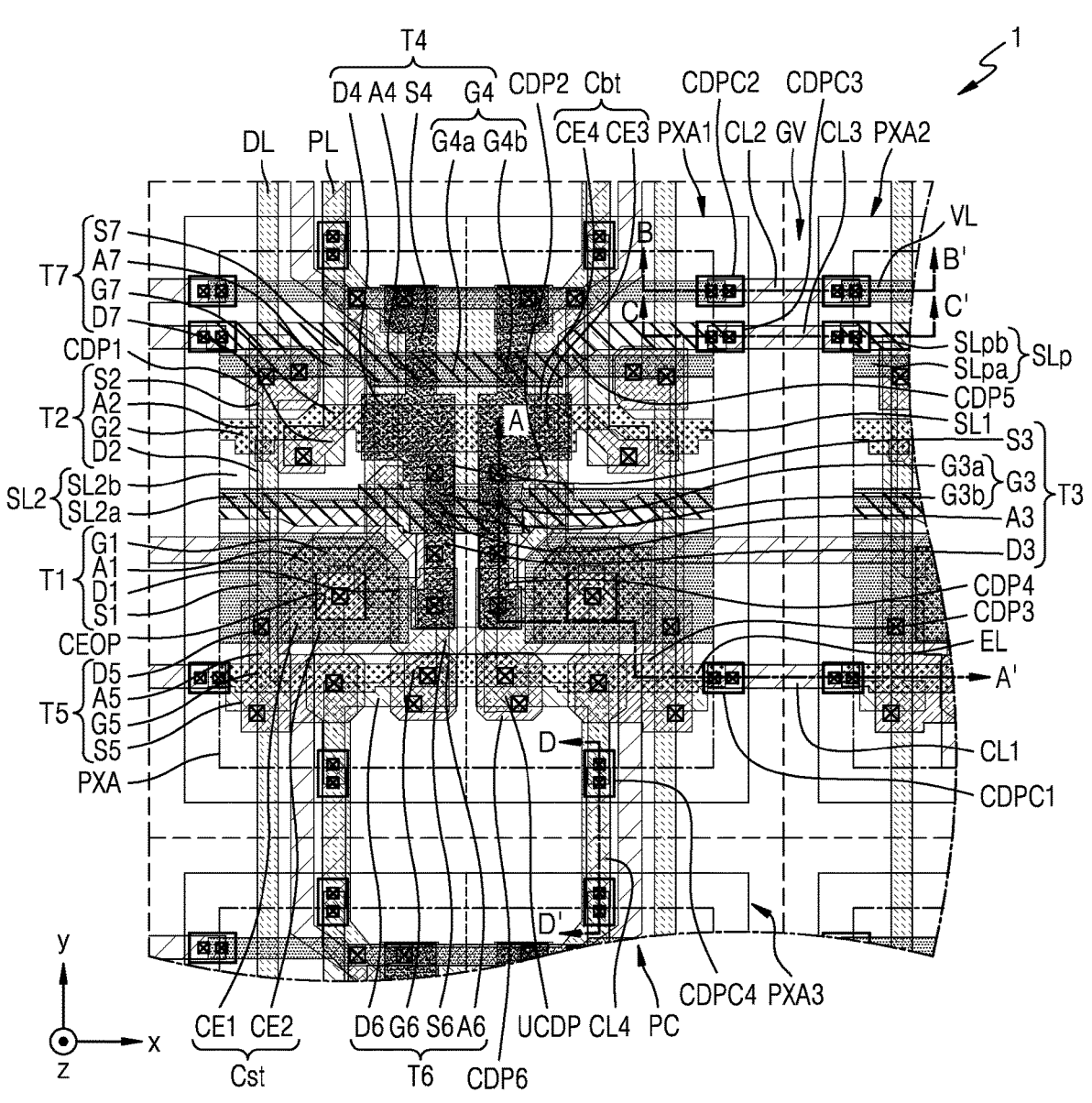
FIG. 3 is a schematic plan view of a sub-pixel area and a pixel circuit of a display apparatus according to an embodiment.

FIG. 3 is a schematic plan view of the sub-pixel area PXA and the pixel circuit PC of the display apparatus 1 according to an embodiment. FIGS. 4A to 4H are schematic arrangement views of FIG. 3 for each layer.

Referring to FIG. 3, a pixel circuit layer PCL (see FIG. 5) according to an embodiment may define the pixel circuit PC overlapping the sub-pixel area PXA in a plan view. The pixel circuit PC may include at least one thin-film transistor. In an embodiment, the pixel circuit PC may include the driving thin-film transistor T1, the switching thin-film transistor T2, the compensation thin-film transistor T3, the first initialization thin-film transistor T4, the operation control thin-film transistor T5, the emission control thin-film transistor T6, the second initialization thin-film transistor T7, the storage capacitor Cst, and the boost capacitor Cbt.

The pixel circuit layer PCL may include a lower conductive layer BML, a first semiconductor layer ACT1, a first gate conductive layer GL1, a second gate conductive layer GL2, a second semiconductor layer ACT2, a third gate conductive layer GL3, an inorganic insulating layer IIL (see FIG. 5), a connection electrode layer CML, and an upper connection electrode layer UCML. The inorganic insulating layer IIL (see FIG. 5) may define a groove GV surrounding the sub-pixel area PXA therein. The groove GV may have a shape formed by removing a portion of the inorganic insulating layer IIL.

In an embodiment, the driving thin-film transistor T1, the switching thin-film transistor T2, the operation control thin-film transistor T5, the emission control thin-film transistor T6, and the second initialization thin-film transistor T7 may be provided as thin-film transistors including a silicon semiconductor. In addition, the compensation thin-film transistor T3 and the first initialization thin-film transistor T4 may be provided as thin-film transistors including an oxide semiconductor.

Figure 4A:
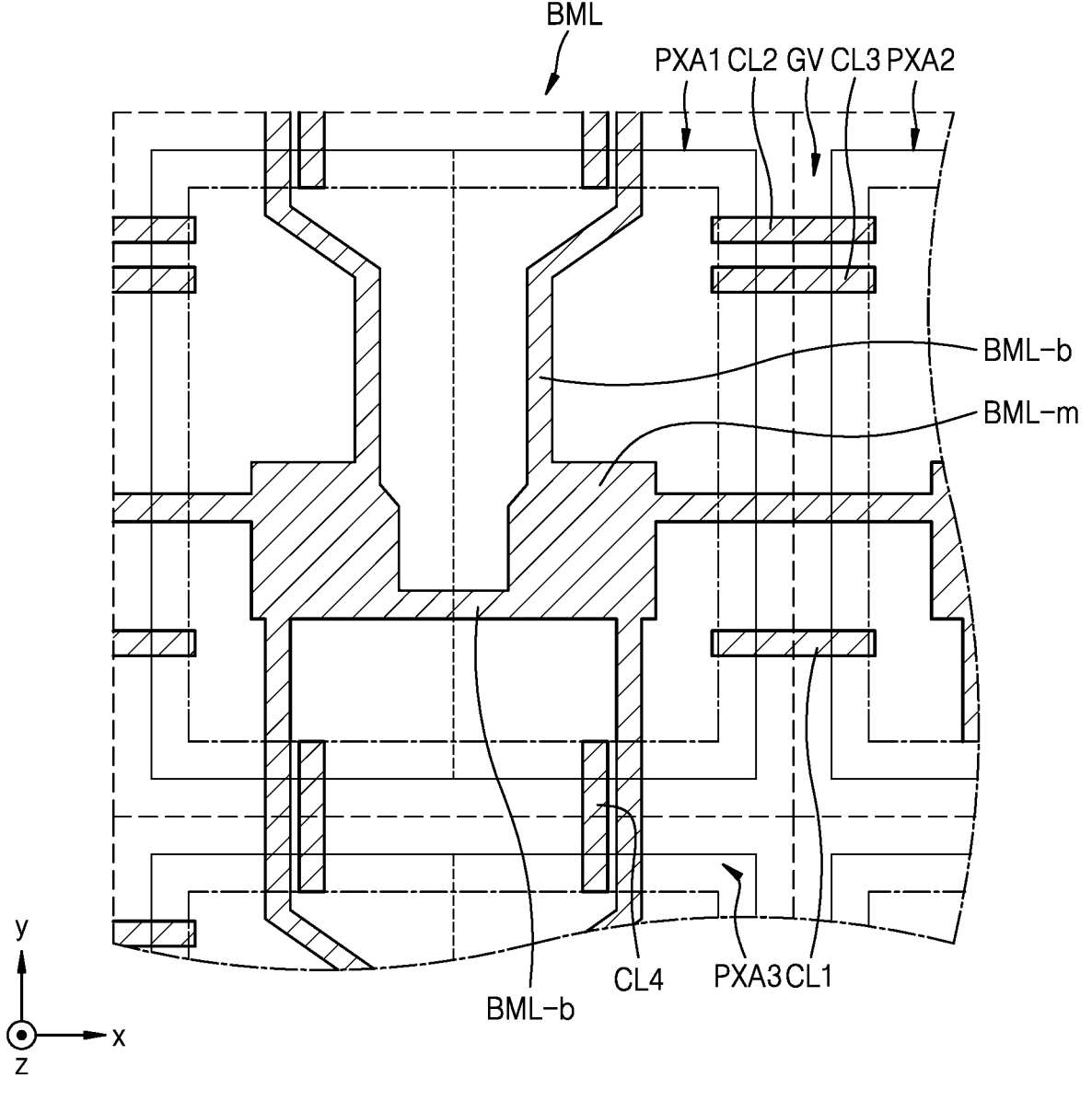
FIGS. 4A to 4H are schematic arrangement views of elements of FIG. 3 for each layer.

FIG. 4A is a schematic plan view of the lower conductive layer BML. The lower conductive layer BML may be disposed on the substrate 100.

The lower conductive layer BML may include a light-blocking material. The lower conductive layer BML may include at least one material among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment, the lower conductive layer BML may have a molybdenum-single layer, a double-layered structure in which a molybdenum layer and a titanium layer are stacked, or a triple-layered structure in which a titanium layer, an aluminum layer, and a titanium layer are stacked.

As shown in FIG. 4A, the lower conductive layer BML may include a main portion BML-m located in each sub-pixel area PXA, and the main portion BML-m may be connected to a branch portion BML-b extending in a first direction x and a second direction y. In an embodiment, the main portions BML-m arranged in adjacent pixel circuits PC, respectively, may be connected to each other through the branch portions BML-b. In another embodiment, the main portions BML-m arranged in the adjacent pixel circuits PC, respectively, may be directly connected to each other.

The main portion BML-m of the lower conductive layer BML may be arranged to overlap the first semiconductor layer ACT1 in a plan view. The main portion BML-m of the lower conductive layer BML may have a shape corresponding to the driving thin-film transistor T1. The main portion BML-m of the lower conductive layer BML may serve as a lower protective metal configured to protect portions of the first semiconductor layer ACT1 overlapping the lower conductive layer BML in a plan view.

The lower conductive layer BML may include a connection line CL. The connection line CL may be connected to a gate conductive layer GL disposed on the lower conductive layer BML. Alternatively, the connection line CL may be connected to the semiconductor layer ACT disposed on the lower conductive layer BML.

The connection line CL may be provided in plurality. The connection line CL may include a first connection line CL1, a second connection line CL2, a third connection line CL3, and a fourth connection line CL4, where the first connection line CL1 is connected to the first gate conductive layer GL1, the second connection line CL2 is connected to the second gate conductive layer GL2, the third connection line CL3 is connected to the third gate conductive layer GL3, and the fourth connection line CL4 is connected to the first semiconductor layer ACT1.

The first connection line CL1 may be connected to the emission control line EL or the first scan line SL1 included in the first gate conductive layer GL1. Though, for simplicity of the drawing, though the first connection line CL1 is shown to be at a position connected to the emission control line EL, the first connection line CL1 may include a plurality of first connection lines CL1, each connected to the first gate conductive layer GL1. As an example, the first connection line CL1 may include the plurality of first connection lines CL1, each connected to the emission control line EL and the first scan line SL1, where the emission control line EL is included in the first gate conductive layer GL1.

The second connection line CL2 may be connected to the initialization voltage line VL, a lower previous scan line SLpa, or a second lower scan line SL2a, where the initialization voltage line VL is included in the second gate conductive layer GL2. Though, for simplicity of the drawing, though the second connection line CL2 is shown to be at a position connected to the initialization voltage line VL, the second connection line CL2 may include a plurality of second connection lines CL2, each connected to the second gate conductive layer GL2. As an example, the second connection line CL2 may include the plurality of second connection lines CL2, each connected to the initialization voltage line VL, the lower previous scan line SLpa, and the second lower scan line SL2a, where the initialization voltage line VL is included in the second gate conductive layer GL2.

The third connection line CL3 may be connected to an upper previous scan line SLpb or a second upper scan line SL2*b* included in the third gate conductive layer GL3. Though, for simplicity of the drawing, though the third connection line CL3 is shown to be at a position connected to the upper previous scan line SLpb, the third connection line CL3 may include a plurality of third connection lines CL3, each connected to the third gate conductive layer GL3. As an example, the third connection line CL3 may include a plurality of third connection lines CL3, each connected to the upper previous scan line SLpb and the second upper scan line SL2*b*, where the upper previous scan line SLpb is included in the third gate conductive layer GL3.

In an embodiment, the fourth connection line CL4 may include a plurality of fourth connection lines CL4, each connected to the first semiconductor layer ACT1. Specific description is made below.

The connection line CL included in the lower conductive layer BML may extend in the first direction x or the second direction y crossing the first direction x. In an embodiment, the first to third connection lines CL1, CL2, and CL3 may extend in the first direction x, and the fourth connection line CL4 may extend in the second direction y. In an embodiment, the plurality of connection lines CL may be arranged to cross the groove GV included in the inorganic insulating layer IIL in a plan view. The groove GV may have a shape formed by removing a portion of the inorganic insulating layer IIL.

The connection line CL may overlap a plurality of adjacent sub-pixel areas PXA. As an example, the first connection line CL1 may overlap a first sub-pixel area PXA1 and a second sub-pixel area PXA2 in a plan view. The fourth connection line CL4 may overlap the first sub-pixel area PXA1 and a third sub-pixel area PXA3 in a plan view.

Figure 4B:
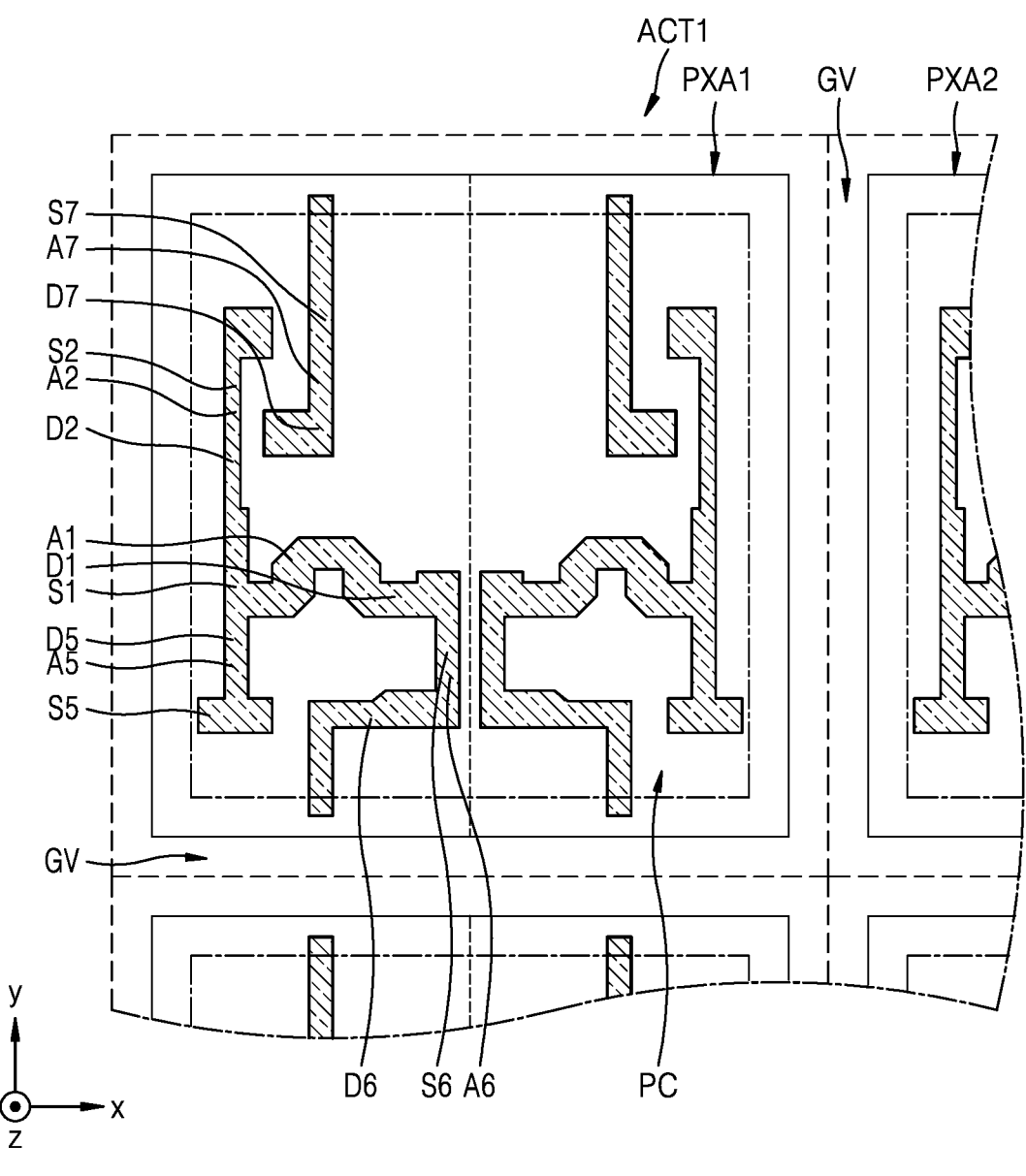

FIG. 4B is a schematic plan view of the first semiconductor layer ACT1. The first semiconductor layer ACT1 may be disposed on the lower conductive layer BML. A lower insulating layer 112 (see FIG. 5) may be disposed between the lower conductive layer BML and the first semiconductor layer ACT1.

Some regions of the first semiconductor layer ACT1 may correspond to semiconductor regions of the driving thin-film transistor T1, the switching thin-film transistor T2, the operation control thin-film transistor T5, the emission control thin-film transistor T6, and the second initialization thin-film transistor T7. In other words, the semiconductor regions of the driving thin-film transistor T1, the switching thin-film transistor T2, the operation control thin-film transistor T5, the emission control thin-film transistor T6, and the second initialization thin-film transistor T7 may be connected to each other and bent in various shapes. The first semiconductor layer ACT1 may include a silicon semiconductor.

The first semiconductor layer ACT1 may include a channel region, a drain region, and a source region, the drain region and the source region being on two opposite sides of the channel region. As an example, the source region and the drain region may be doped with impurities. The impurities may include N-type impurities or P-type impurities. The source region and the drain region may be understood to be a source electrode and a drain electrode of a relevant thin-film transistor. Hereinafter, for convenience of description, the source electrode and the drain electrode are described as the source region and the drain region.

The driving thin-film transistor T1 may include a driving channel region A1, a driving source region S1, a driving drain region D1, and a driving gate electrode G1, where the driving source region S1 and a driving drain region D1 are on two opposite sides of the driving channel region A1, respectively, and the driving gate electrode G1 overlaps the driving channel region A1 in a plan view. The driving channel region A1 may maintain a long channel length inside a narrow space by including a shape such as an omega shape. In the case where the length of the driving channel region A1 is long, a driving range of a gate voltage widens, and the grayscale of light emitted from a display element may be controlled more elaborately, and a display quality may be improved. The driving thin-film transistor T1 may overlap the main portion BML-m of the lower conductive layer BML in a plan view, and thus, be protected by the lower conductive layer BML.

The switching thin-film transistor T2 may include a switching channel region A2, a switching source region S2, a switching drain region D2, and a switching gate electrode G2, where the switching source region S2 and the switching drain region D2 are on two opposite sides of the switching channel region A2, respectively, and the switching gate electrode G2 overlaps the switching channel region A2 in a plan view. The switching drain region D2 may be connected to the driving source region S1.

The operation control thin-film transistor T5 may include an operation control channel region A5, an operation control source region S5, an operation control drain region D5, and an operation control gate electrode G5, where the operation control source region S5 and the operation control drain region D5 are on two opposite sides of the operation control channel region A5, respectively, and the operation control gate electrode G5 overlaps the operation control channel region A5 in a plan view. The operation control drain region D5 may be connected to the driving source region S1. The operation control drain region D5 may be connected to the switching drain region D2.

The emission control thin-film transistor T6 may include an emission control channel region A6, an emission control source region S6, an emission control drain region D6, and an emission control gate electrode G6, where the emission control source region S6 and the emission control drain region D6 are on two opposite sides of the emission control channel region A6, respectively, and the emission control gate electrode G6 overlaps the emission control channel region A6 in a plan view. The emission control source region S6 may be connected to the driving drain region D1.

The second initialization thin-film transistor T7 may include a second initialization channel region A7, a second initialization source region S7, a second initialization drain region D7, and a second initialization gate electrode G7, where the second initialization source region S7 and the second initialization drain region D7 are on two opposite sides of the second initialization channel region A7, and the second initialization gate electrode G7 overlaps the second initialization channel region A7 in a plan view. The second initialization source region S7 may be connected to the emission control drain region D6.

In an embodiment, the first semiconductor layer ACT1 may not extend to the adjacent sub-pixel area PXA. The first semiconductor layer ACT1 may be arranged not to pass across the groove GV of the inorganic insulating layer IIL in a plan view.

The first semiconductor layer ACT1 may be connected to the lower conductive layer BML. The first semiconductor layer ACT1 may be connected to the first semiconductor layer ACT1 of the adjacent sub-pixel area PXA through the fourth connection line CL4 of the lower conductive layer BML. In this case, the depth of the groove GV defined in the inorganic insulating layer IIL may be deeper. Detailed description thereof is made with reference to a cross-sectional view thereof. For convenience, a portion of the first semiconductor layer ACT1 that may be connected to the lower conductive layer BML is shown to protrude.

Though omitted for simplification of the drawing, a portion of the first semiconductor layer ACT1 not connected through the fourth connection line CL4 of the lower conductive layer BML may extend in the first direction x or the second direction y. In this case, the first semiconductor layer ACT1 may be directly connected to the first semiconductor layer ACT1 included in the adjacent sub-pixel area PXA. The first semiconductor layer ACT1 may be arranged to pass across the groove GV of the inorganic insulating layer IIL in a plan view.

Figure 4C:
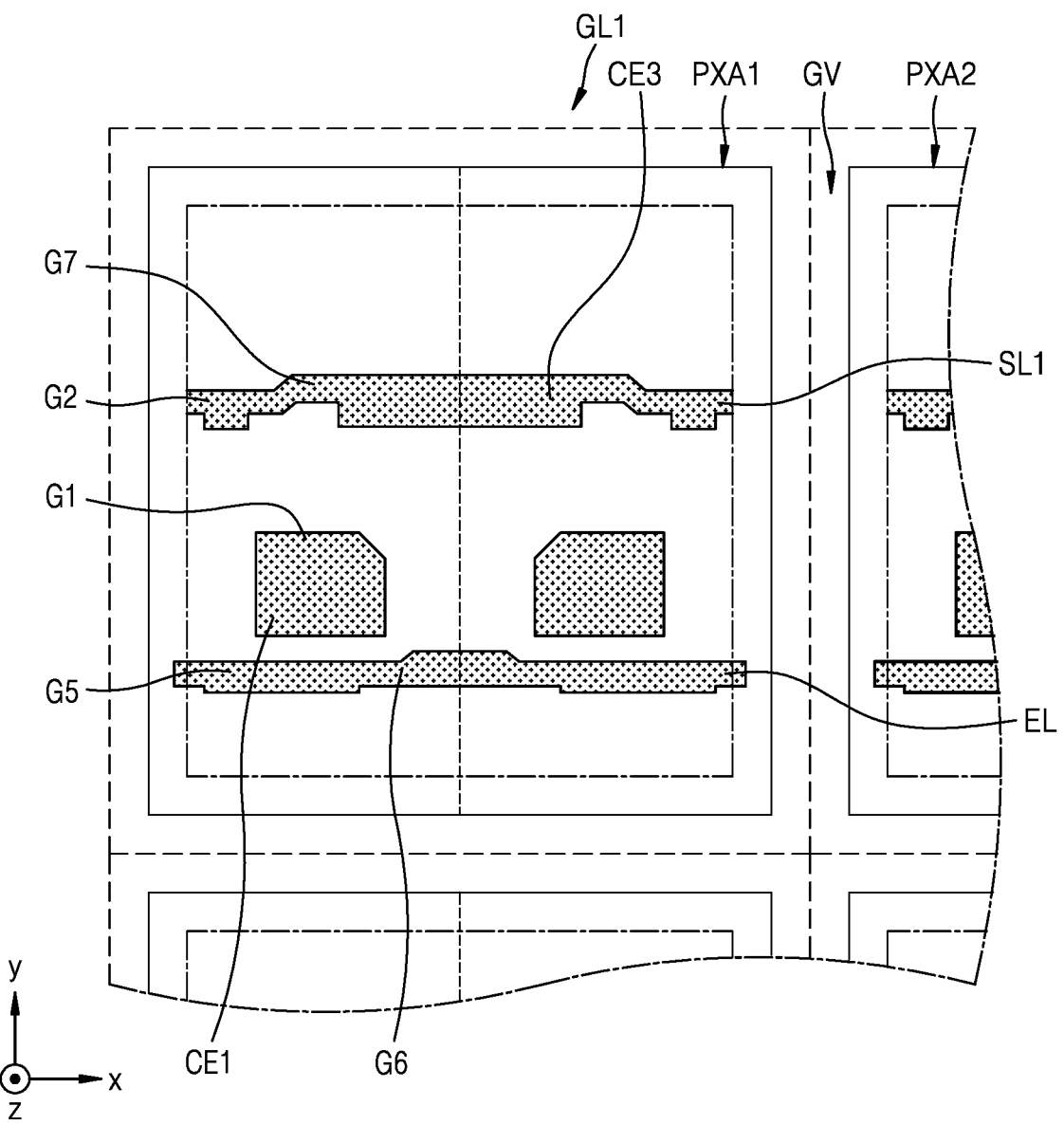

FIG. 4C is a schematic plan view of the first gate conductive layer GL1. The first gate conductive layer GL1 may be disposed on the lower conductive layer BML. The first gate conductive layer GL1 may be disposed over the first semiconductor layer ACT1 with at least one insulating layer therebetween. The first gate conductive layer GL1 may include the first scan line SL1, the emission control line EL, and the driving gate electrode G1.

Regions of the first scan line SL1 may correspond to the switching gate electrode G2, the second initialization gate electrode G7, and the third electrode CE3 of the boost capacitor Cbt. As an example, a region of the first scan line SL1 overlapping the switching channel region A2 may be the switching gate electrode G2 in a plan view. In addition, a region of the first scan line SL1 overlapping the second initialization channel region A7 may be the second initialization gate electrode G7. A region of the first scan line SL1 overlapping the second semiconductor layer ACT2 in a plan view may be the third electrode CE3.

Regions of the emission control line EL may correspond to the operation control gate electrode G5 and the emission control gate electrode G6. As an example, a region of the emission control line EL overlapping the operation control channel region A5 in a plan view may be the operation control gate electrode G5. In addition, a region of the emission control line EL overlapping the emission control channel region A6 in a plan view may be the emission control gate electrode G6.

The driving gate electrode G1 may be connected to the compensation thin-film transistor T3 through a second conductive pattern CDP2 described below.

In an embodiment, the first scan line SL1, the emission control line EL, and the driving gate electrode G1 may be disposed on the same layer and may include the same material.

In an embodiment, the first scan line SL1 or the emission control line EL may not extend to the adjacent sub-pixel area PXA. The first scan line SL1 or the emission control line EL may be arranged not to pass across the groove GV defined by the inorganic insulating layer IIL in a plan view.

The emission control line EL may be connected to the lower conductive layer BML. The emission control line EL may be connected to the emission control line EL of the adjacent sub-pixel area PXA through the first connection line CL1 of the lower conductive layer BML. For convenience, a portion of the emission control line EL that may be connected to the lower conductive layer BML is shown to protrude.

Though it is shown that a portion of the first gate conductive layer GL1 connected to the lower conductive layer BML is the emission control line EL, a portion of the first gate conductive layer GL1 connected to the lower conductive layer BML may be the first scan line SL1 in an embodiment. In another embodiment, the first connection line CL1 of the lower conductive layer BML connected to the first gate conductive layer GL1 may be provided in plurality, and the emission control line EL and the first scan line SL1 may be connected to the plurality of first connection lines CL1 of the lower conductive layer BML, respectively. That is, a portion of the first gate conductive layer GL1 connected to the lower conductive layer BML may be selectively provided when needed.

Though omitted for simplification of the drawing, the first scan line SL1 or the emission control line EL not connected through the first connection line CL1 of the lower conductive layer BML may extend in the first direction x. In this case, the first scan line SL1 and the emission control line EL may be directly connected to the first scan line SL1 and the emission control line EL included in the adjacent sub-pixel area PXA. The first scan line SL1 and the emission control line EL may be arranged to pass across the groove GV of the inorganic insulating layer IIL in a plan view.

Figure 4D:
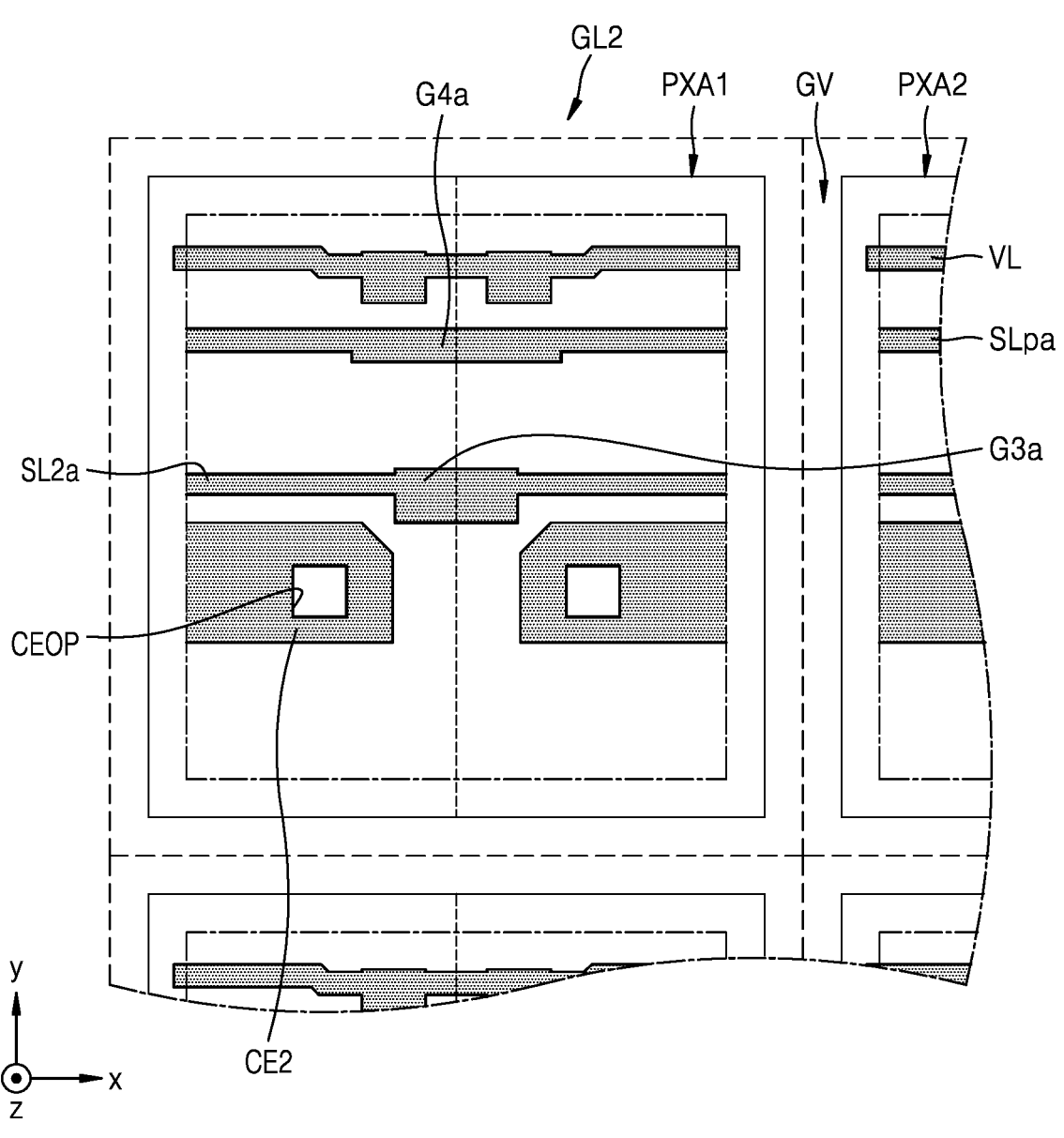

FIG. 4D is a schematic plan view of the second gate conductive layer GL2. The second gate conductive layer GL2 may be disposed on at least one insulating layer covering the first gate conductive layer GL1. The second gate conductive layer GL2 may include the initialization voltage line VL, the lower previous scan line SLpa, the second lower scan line SL2a, and the second electrode CE2.

In an embodiment, the initialization voltage line VL may be connected to the first initialization thin-film transistor T4 and the second initialization thin-film transistor T7 through a fifth conductive pattern CDP5 described below. The initialization voltage line VL may have a constant voltage (e.g., −2 voltages (V) or the like). In an embodiment, a region of the lower previous scan line SLpa may correspond to a first initialization lower gate electrode G4a. In an embodiment, a region of the second lower scan line SL2a may correspond to a first initialization lower compensation gate electrode G3a.

The second electrode CE2 may overlap the driving gate electrode G1 in a plan view and constitute the storage capacitor Cst in cooperation with the driving gate electrode G1. The storage capacitor Cst may include the first electrode CE1 and the second electrode CE2. The first electrode CE1 may be the driving gate electrode G1. That is, the first electrode CE1 may be integrally formed with the driving gate electrode G1. In this case, the storage capacitor Cst may be arranged to overlap the driving thin-film transistor T1. The second electrode CE2 may define an opening CEOP therein having a closed curve shape. The opening CEOP may expose the central portion of the first electrode CE1.

The initialization voltage line VL, the lower previous scan line SLpa, the second lower scan line SL2a, and the second electrode CE2 may be disposed on the same layer and may include the same material.

In an embodiment, the initialization voltage line VL, the lower previous scan line SLpa, or the second lower scan line SL2a may not extend to the adjacent sub-pixel area PXA. The initialization voltage line VL, the lower previous scan line SLpa, or the second lower scan line SL2a may be arranged not to pass across the groove GV defined in the inorganic insulating layer IIL in a plan view.

The initialization voltage line VL may be connected to the lower conductive layer BML. The initialization voltage line VL may be connected to the initialization voltage line VL of the adjacent sub-pixel area PXA through the second connection line CL2 of the lower conductive layer BML. For convenience, a portion of the initialization voltage line VL that may be connected to the lower conductive layer BML is shown to protrude.

Though it is shown that a portion of the second gate conductive layer GL2 connected to the lower conductive layer BML is the initialization voltage line VL, a portion of the second gate conductive layer GL2 connected to the lower conductive layer BML may be one of the lower previous scan line SLpa and the second lower scan line SL2a in an embodiment. In another embodiment, the second connection line CL2 of the lower conductive layer BML connected to the second gate conductive layer GL2 may be provided in plurality, and the initialization voltage line VL, the lower previous scan line SLpa, and the second lower scan line SL2a may be connected to the plurality of second connection lines CL2 of the lower conductive layer BML, respectively. That is, a portion of the second gate conductive layer GL2 connected to the lower conductive layer BML may be selectively provided when needed.

Though omitted for simplification of the drawing, the initialization voltage line VL, the lower previous scan line, or the second lower scan line SL2a not connected through the second connection line CL2 of the lower conductive layer BML may extend in the first direction x. In this case, the initialization voltage line VL, the lower previous scan line SLpa, and the second lower scan line SL2a may be directly connected to the initialization voltage line VL, the lower previous scan line SLpa, and the second lower scan line SL2a included in the adjacent sub-pixel area PXA. The initialization voltage line VL, the lower previous scan line SLpa, or the second lower scan line SL2a may be arranged to pass across the groove GV defined by the inorganic insulating layer IIL in a plan view.

Figure 4E:
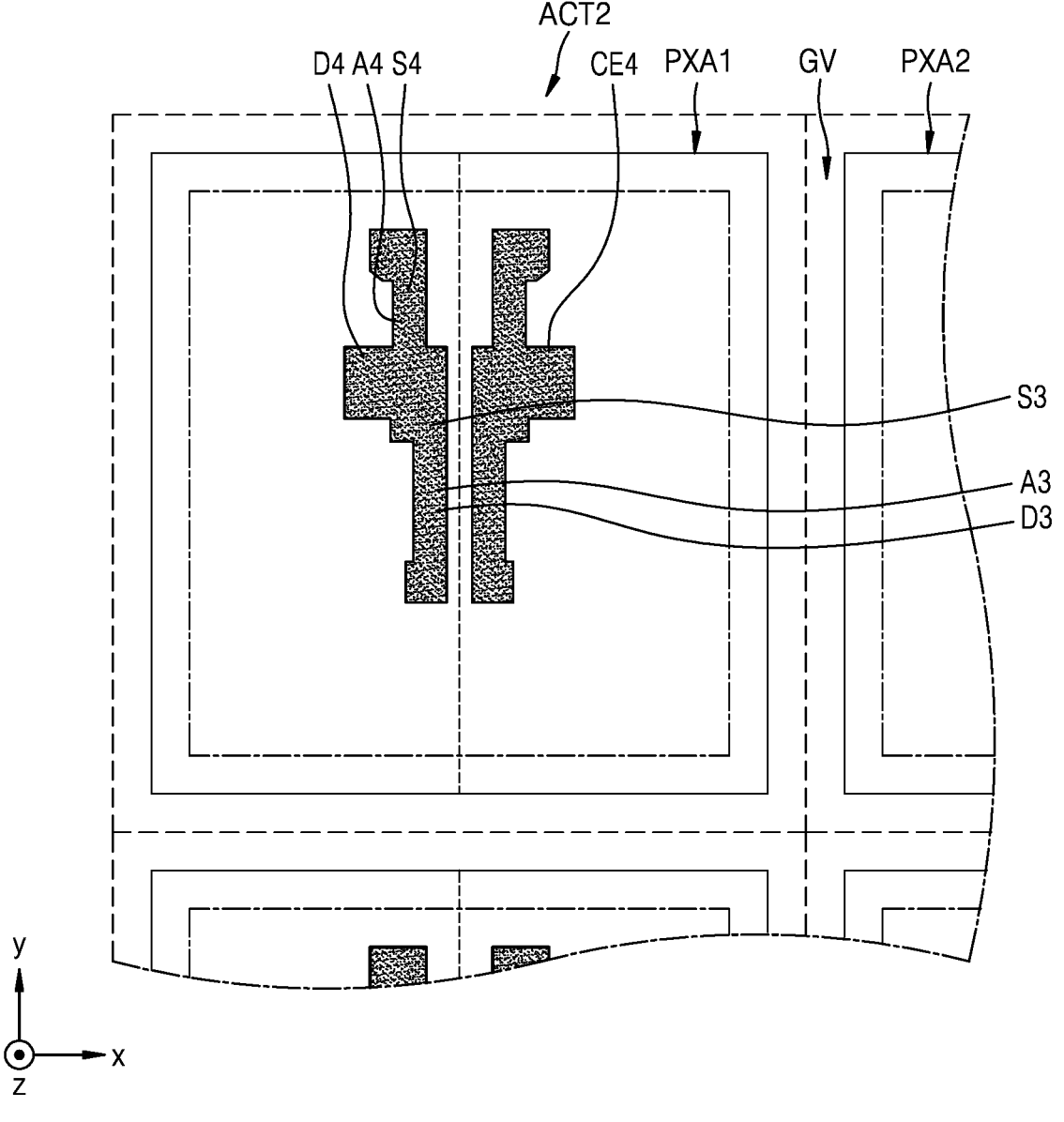

FIG. 4E is a schematic plan view of the second semiconductor layer ACT2. The second semiconductor layer ACT2 may be disposed on at least one insulating layer covering the second gate conductive layer GL2. The second semiconductor layer ACT2 may include an oxide semiconductor. At least one thin-film transistor may be arranged along the second semiconductor layer ACT2 including an oxide semiconductor. Some regions of the second semiconductor layer ACT2 may correspond to semiconductor regions of the compensation thin-film transistor T3 and the first initialization thin-film transistor T4. In other words, the semiconductor regions of the compensation thin-film transistor T3 and the first initialization thin-film transistor T4 may be connected to each other.

The second semiconductor layers ACT2 may each include a channel region, a drain region, and a source region, the drain region and the source region being on two opposite sides of the channel region. The second semiconductor layer ACT2 may include a channel region, a drain region, and a source region, the drain region and the source region being on two opposite sides of the channel region. As an example, a source region and a drain region may be regions in which carrier concentration thereof is increased by plasma treatment. The source region and the drain region may correspond to a source electrode and a drain electrode, respectively. Hereinafter, terms such as the source region and the drain region are used instead of the source electrode and the drain electrode.

The compensation thin-film transistor T3 may include a compensation channel region A3, a compensation source region S3, a compensation drain region D3, and a compensation gate electrode G3, where the compensation source region S3 and the compensation drain region D3 are on two opposite sides of the compensation channel region A3, respectively, and the compensation gate electrode G3 overlaps the compensation channel region A3 in a plan view. The compensation source region S3 may be electrically connected to the driving gate electrode G1 through the second conductive pattern CDP2 described below. The compensation source region S3 may be connected to the fourth electrode CE4 of the boost capacitor Cbt. In an embodiment, the compensation source region S3 may be integrally provided with the fourth electrode CE4 of the boost capacitor Cbt. In other words, the boost capacitor Cbt includes the third electrode CE3 and the fourth electrode CE4. When a first scan signal Sn' supplied through the first scan line SL1 is turned off, the boost capacitor Cbt may raise the voltage of the second conductive pattern CDP2 described below. As described above, when the voltage of the second conductive pattern CDP2 is raised, a black grayscale may be clearly expressed. The compensation drain region D3 may be electrically connected to the emission control source region S6 through a fourth conductive pattern CDP4 described below.

The first initialization thin-film transistor T4 may include a first initialization channel region A4, a first initialization source region S4, a first initialization drain region D4, and a first initialization gate electrode G4, where the first initialization source region S4 and the first initialization drain region D4 are on two opposite sides of the first initialization channel region A4, respectively, and the first initialization gate electrode G4 overlaps the first initialization channel region A4 in a plan view. The first initialization drain region D4 may be connected to the compensation source region S3. The first initialization source region S4 may be connected to a fifth conductive pattern CDP5 described below. Accordingly, the first initialization source region S4 may be electrically connected to the initialization voltage line VL.

Figure 4F:
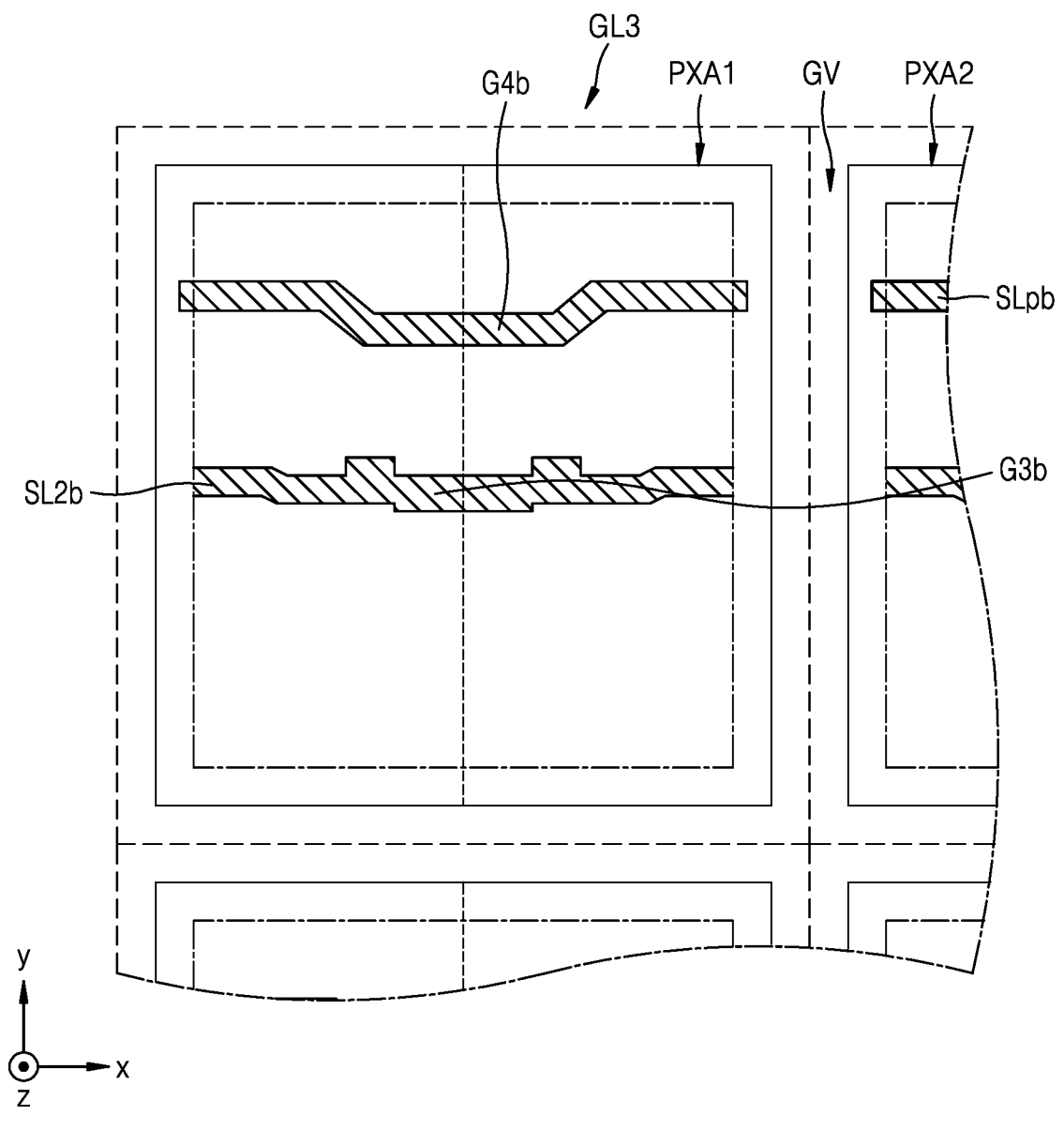

FIG. 4F is a schematic plan view of the third gate conductive layer GL3. The third gate conductive layer GL3 may be disposed on at least one insulating layer covering the second semiconductor layer ACT2. The third gate conductive layer GL3 may include the upper previous scan line SLpb and the second upper scan line SL2b.

The upper previous scan line SLpb may constitute the previous scan line SLp in cooperation with the lower previous scan line SLpa. In other words, the previous scan line SLp may include the upper previous scan line SLpb and the lower previous scan line SLpa. In an embodiment, one of the lower previous scan line SLpa and the upper previous scan line SLpb may be omitted.

A region of the upper previous scan line SLpb may correspond to a first initialization upper gate electrode G4b. The first initialization upper gate electrode G4b may constitute the first initialization gate electrode G4 in cooperation with the first initialization lower gate electrode G4a. In other words, the first initialization gate electrode G4 may include the first initialization lower gate electrode G4a and the first initialization upper gate electrode G4b. In this structure, the first initialization thin-film transistor T4 may have a double-gate structure. In an embodiment, one of the first initialization lower gate electrode G4a and the first initialization upper gate electrode G4b may be omitted. In this structure, the first initialization thin-film transistor T4 may have a single-gate structure.

The second upper scan line SL2b may constitute the second scan line SL2 in cooperation with the second lower scan line SL2a. In other words, the second scan line SL2 may include the second lower scan line SL2a and the second upper scan line SL2b. In an embodiment, one of the second lower scan line SL2a and the second upper scan line SL2b may be omitted.

A region of the second upper scan line SL2b may correspond to the upper compensation gate electrode G3b. The upper compensation gate electrode G3b may constitute the compensation gate electrode G3 in cooperation with the lower compensation gate electrode G3a. In other words, the compensation gate electrode G3 may include the lower compensation gate electrode G3a and the upper compensation gate electrode G3b. In this structure, the compensation thin-film transistor T3 may have a double-gate structure. In an embodiment, at least one of the lower compensation gate electrode G3a and the upper compensation gate electrode G3b may be omitted. In this structure, the compensation thin-film transistor T3 may have a single-gate structure.

In an embodiment, the upper previous scan line SLpb or the second upper scan line SL2b may not extend to the adjacent sub-pixel area PXA. The upper previous scan line SLpb or the second upper scan line SL2b may be arranged not to pass across the groove GV of the inorganic insulating layer IIL in a plan view.

The upper previous scan line SLpb may be connected to the lower conductive layer BML. The upper previous scan line SLpb may be connected to the upper previous scan line SLpb of the adjacent sub-pixel area PXA through the third connection line CL3 of the lower conductive layer BML. For convenience, a portion of the upper previous scan line SLpb that may be connected to the lower conductive layer BML is shown to protrude.

Though it is shown that a portion of the third gate conductive layer GL3 connected to the lower conductive layer BML is the upper previous scan line SLpb, a portion of the third gate conductive layer GL3 connected to the lower conductive layer BML may be the second upper scan line SL2b in an embodiment. In another embodiment, the third connection line CL3 of the lower conductive layer BML connected to the third gate conductive layer GL3 may be provided in plurality, and the upper previous scan line SLpb and the second upper scan line SL2b may be connected to the plurality of third connection lines CL3 of the lower conductive layer BML, respectively. That is, a portion of the third gate conductive layer GL3 connected to the lower conductive layer BML may be selectively provided when needed.

Though omitted for simplification of the drawing, the upper previous scan line SLpb or the second upper scan line SL2b not connected through the third connection line CL3 of the lower conductive layer BML may extend in the first direction x. In this case, the upper previous scan line SLpb and the second upper scan line SL2b may be directly connected to the upper previous scan line SLpb and the second upper scan line SL2b included in the adjacent sub-pixel area PXA. The upper previous scan line SLpb or the second upper scan line SL2b may be arranged to pass across the groove GV defined in the inorganic insulating layer IIL in a plan view.

Figure 4G:
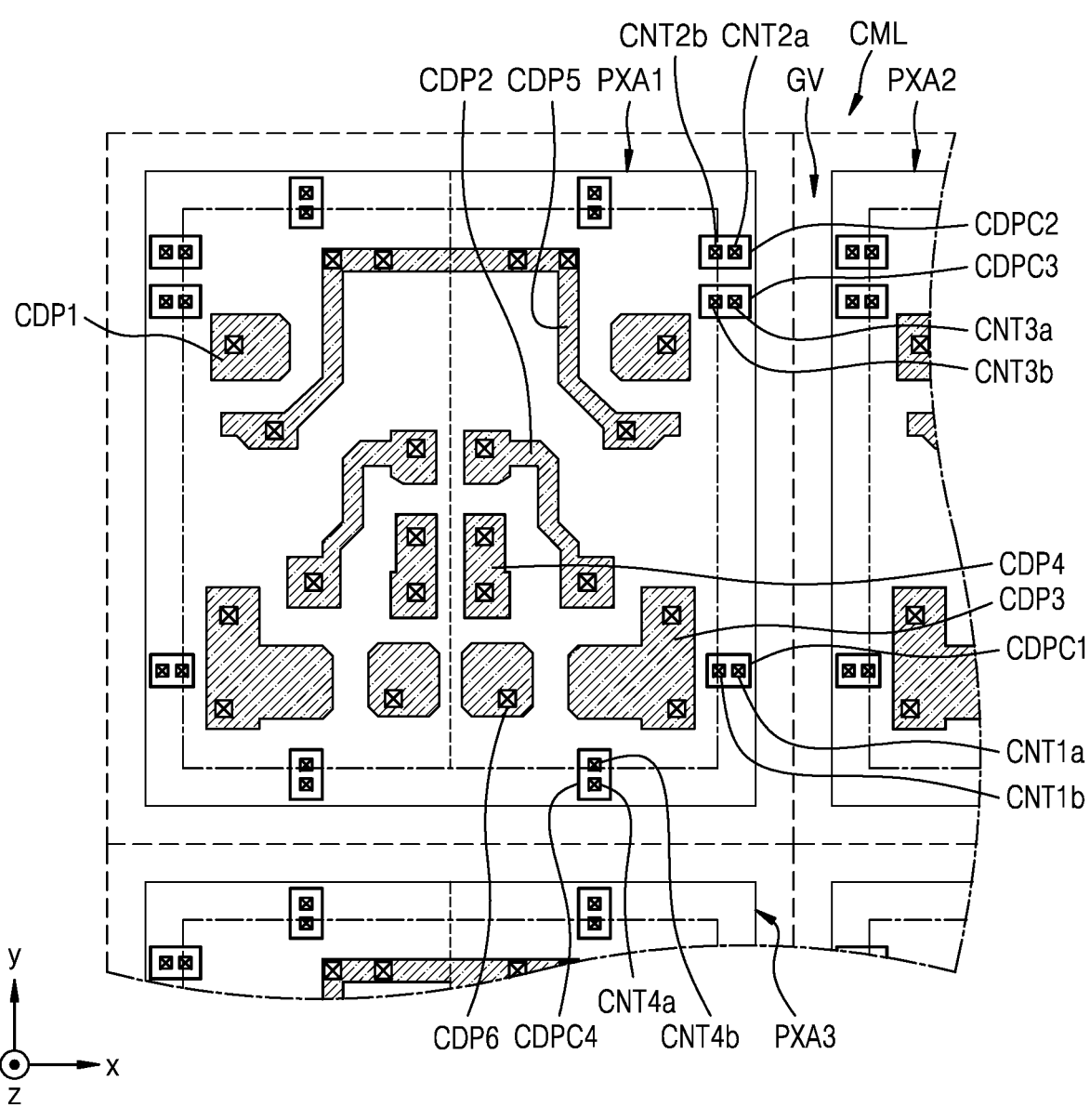

FIG. 4G is a schematic plan view of the connection electrode layer CML. The connection electrode layer CML may be disposed on the inorganic insulating layer K. The connection electrode layer CML may include a plurality of conductive patterns CDP and a connection electrode CDPC.

In an embodiment, the plurality of conductive patterns CDP may include a first conductive pattern CDP1, the second conductive pattern CDP2, the third conductive pattern CDP3, the fourth conductive pattern CDP4, the fifth conductive pattern CDP5, and a sixth conductive pattern CDP6.

The first conductive pattern CDP1 may electrically connect the switching source region S2 to the data line DL. The second conductive pattern CDP2 may electrically connect the driving gate electrode G1 to the compensation source region S3. In an embodiment, the second conductive pattern CDP2 may electrically connect the driving gate electrode G1 to the compensation source region S3 through the opening CEOP of the second electrode CE2. The third conductive pattern CDP3 may electrically connect the driving voltage line PL to the operation control source region S5. The third conductive pattern CDP3 may electrically connect the driving voltage line PL to the second electrode CE2. The fourth conductive pattern CDP4 may electrically connect the compensation drain region D3 to the emission control source region S6. The fifth conductive pattern CDP5 may electrically connect the first initialization source region S4 to the initialization voltage line VL. The fifth conductive pattern CDP5 may electrically connect the second initialization drain region D7 to the initialization voltage line VL. The sixth conductive pattern CDP6 may electrically connect the emission control drain region D6 to an upper conductive pattern UCDP described below.

In an embodiment, the plurality of conductive patterns CDP may be disposed on the same layer and may include the same material.

In an embodiment, the plurality of connection electrodes CDPC may include a first connection electrode CDPC1, a second connection electrode CDPC2, a third connection electrode CDPC3, and a fourth connection electrode CDPC4.

The first connection electrode CDPC1 may connect the first connection line CL1 of the lower conductive layer BML to the first gate conductive layer GL1 through a contact hole. The second connection electrode CDPC2 may connect the second connection line CL2 of the lower conductive layer BML to the second gate conductive layer GL2 through a contact hole. The third connection electrode CDPC3 may connect the third connection line CL3 of the lower conductive layer BML to the third gate conductive layer GL3 through a contact hole. The fourth connection electrode CDPC4 may connect the fourth connection line CL4 of the lower conductive layer BML to the first semiconductor layer ACT1 through a contact hole. Specific description is made below.

As described below, among wirings included in the gate conductive layer GL and the first semiconductor layer ACT1, a wiring connected to the adjacent sub-pixel area PXA through the connection line CL of the lower conductive layer BML may be selected when needed. Accordingly, a connection electrode CDPC for connection may be additionally arranged.

Figure 4H:
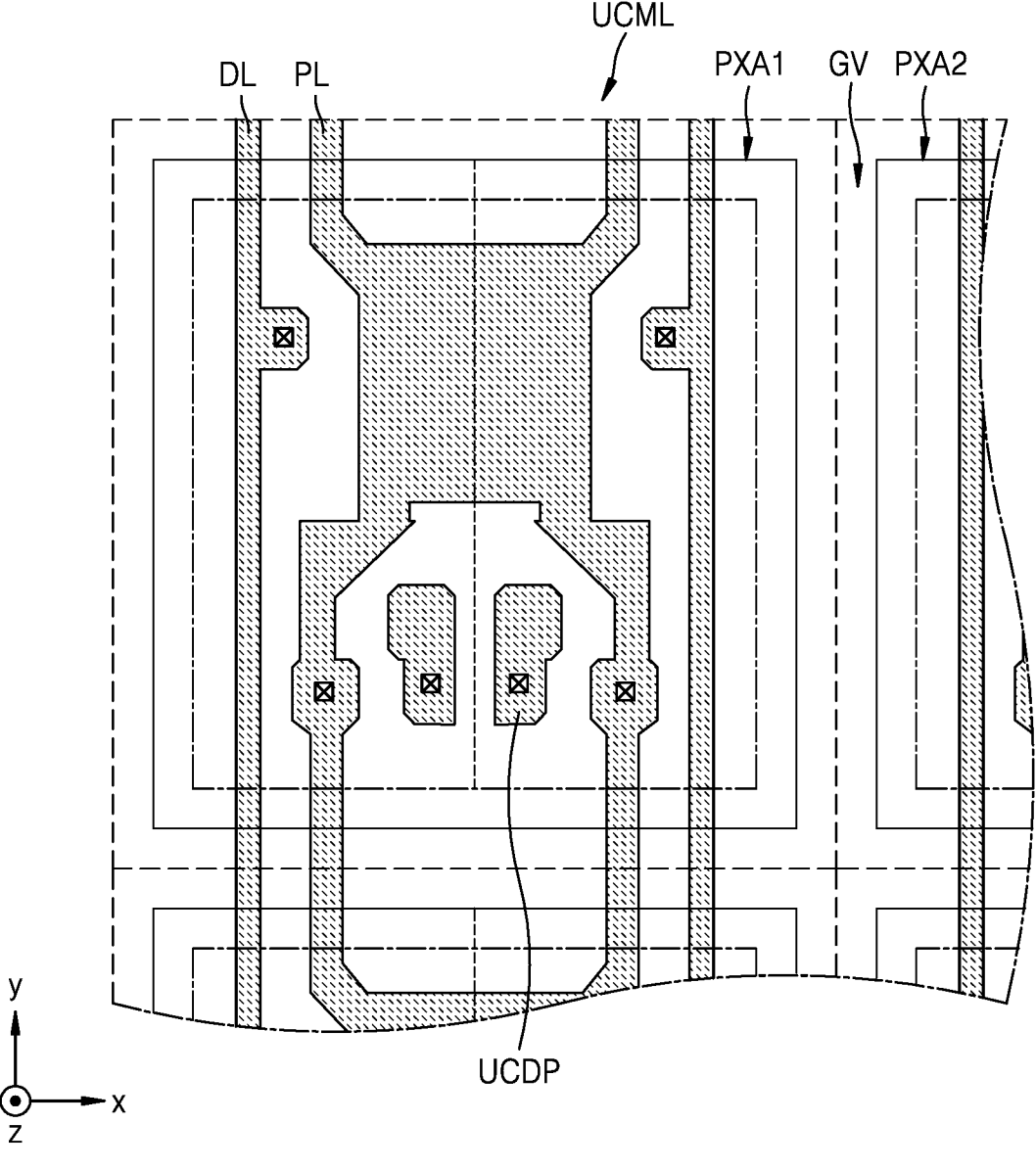

FIG. 4H is a schematic plan view of the upper connection electrode layer UCML. The upper connection electrode layer UCML may be disposed on at least one insulating layer covering the connection electrode layer CML.

The upper connection electrode layer UCML may include the driving voltage line PL, the data line DL, and the upper conductive pattern UCDP. The driving voltage line PL may extend in the second direction y crossing the first direction x. In an embodiment, the driving voltage line PL may substantially extend in the second direction y. Because the driving voltage line PL is disposed on an organic insulating layer OIL filling the groove GV defined by the inorganic insulating layer IIL, there may be less danger of disconnection even when the driving voltage line PL passes across the groove GV in a plan view. The driving voltage line PL may be electrically connected to the second electrode CE2 and the operation control source region S5 through the third conductive pattern CDP3.

The data line DL may extend in the second direction y. Because the data line DL is disposed on an organic insulating layer OIL filling the groove GV of the inorganic insulating layer IIL, there may be less danger of disconnection even when the driving voltage line PL passes across the groove GV in a plan view. The data line DL may be electrically connected to the switching source region S2 through the first conductive pattern CDP1. A portion of the data line DL may be understood to be the switching source electrode.

The upper conductive pattern UCDP may be electrically connected to the sixth conductive pattern CDP6. Though not shown, the upper conductive pattern UCDP may be electrically connected to an organic light-emitting diode as a display element.

In an embodiment, the driving voltage line PL, the data line DL, and the upper conductive pattern UCDP may be disposed on the same layer and may include the same material.

FIGS. 5 to 8 are cross-sectional views of the sub-pixel area and the pixel circuit, taken along lines A-A', B-B', C-C', and D-D' of FIG. 3, respectively.

The structure of the display apparatus according to an embodiment is specifically described according to a stacking order with reference to FIGS. 5 to 8.

First, a substrate 100 may be disposed. The substrate 100 may include the sub-pixel area PXA. In an embodiment, the substrate 100 may include a plurality of sub-pixel areas PXA. In an embodiment, one pixel circuit PC may be arranged in the sub-pixel area PXA. In an embodiment, one organic light-emitting diode OLED may be arranged in the sub-pixel area PXA.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked and provided in the substrate 100. In another embodiment, the substrate 100 may include glass.

At least one of the first base layer 100a and the second base layer 100c may include a polymer resin including polyethersulfone, polyacrylate, polyetherimide, polyethylene naphthalate, polyethylene terephthalate, polyphenylene sulfide, polyimide, polycarbonate, cellulose tri acetate, and cellulose acetate propionate.

The first barrier layer 100b and the second barrier layer 100d are barrier layers configured to prevent penetration of external foreign materials and may be a single layer or a multi-layer including inorganic materials such as silicon nitride ($SiN_x$), silicon oxide ($SiO_2$), and/or silicon oxynitride (SiON).

A pixel circuit layer PCL defining the pixel circuit PC may be disposed on the substrate 100. The pixel circuit PC may overlap the sub-pixel area PXA in a plan view. The pixel circuit PC may include at least one thin-film transistor and/or at least one storage capacitor.

The pixel circuit layer PCL may include a buffer layer 111, the lower conductive layer BML, the first semiconductor layer ACT1, the first gate conductive layer GL1, the second gate conductive layer GL2, the second semiconductor layer ACT2, the third gate conductive layer GL3, the inorganic insulating layer IIL including the groove GV, a connection electrode layer CML, and an upper connection electrode layer UCML.

The buffer layer 111 may be disposed on the substrate 100. The buffer layer 111 may include an inorganic insulating material such as silicon nitride ($SiN_x$), silicon oxynitride (SiON), and silicon oxide ($SiO_2$), and include a single layer or a multi-layer including the inorganic insulating materials.

The lower conductive layer BML may be disposed on the buffer layer 111. The main portion BML-m of the lower conductive layer BML may be arranged to overlap the first semiconductor layer ACT1 in a plan view. The main portion BML-m of the lower conductive layer BML may have a shape corresponding to the driving thin-film transistor T1. The lower conductive layer BML may serve as a lower protective metal configured to protect a portion of the first semiconductor layer ACT1 overlapping the lower conductive layer BML in a plan view.

Figure 5:
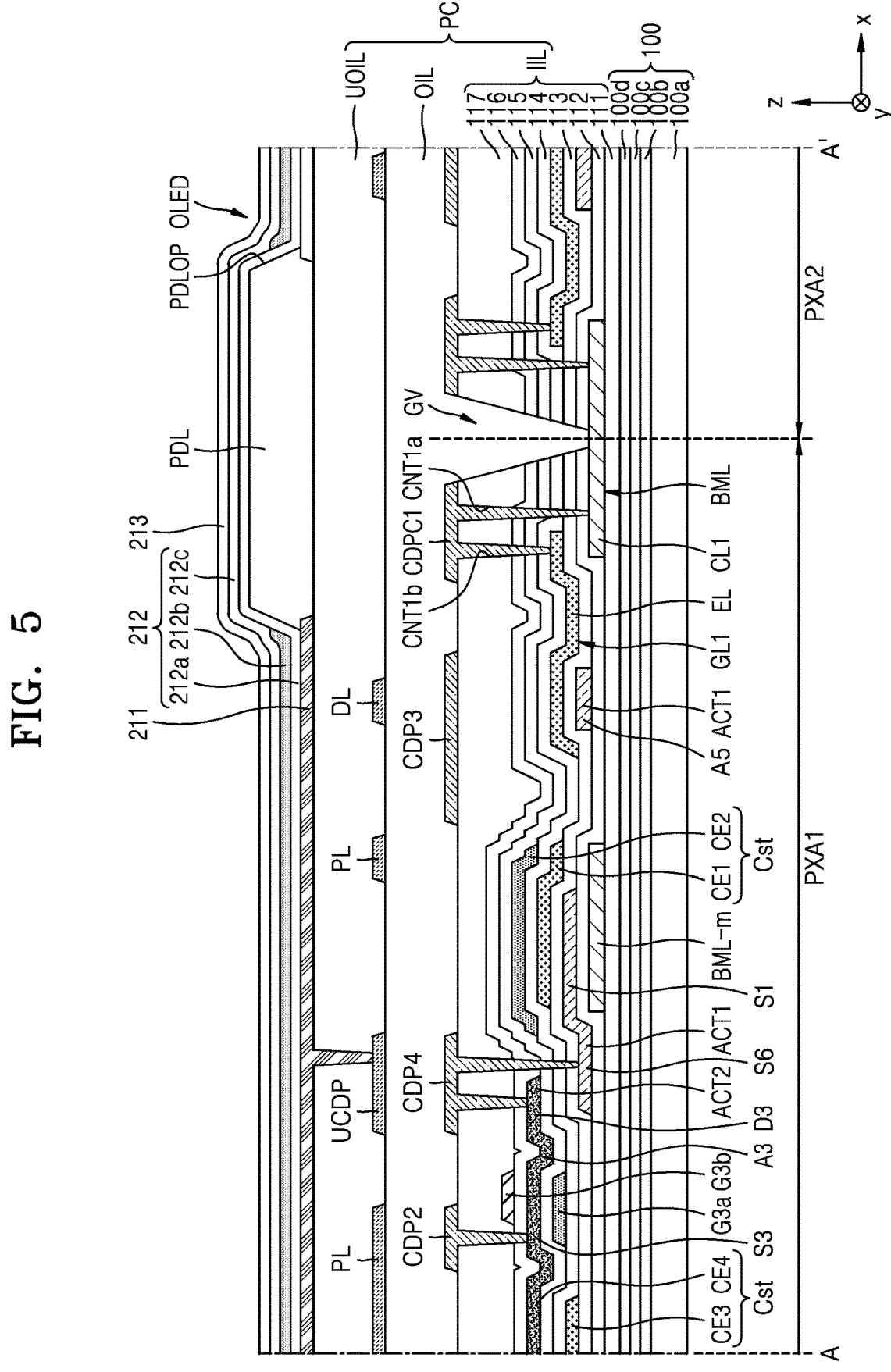
FIGS. 5 to 8 are cross-sectional views of the sub-pixel area and the pixel circuit, taken along lines A-A', B-B', C-C', and D-D' of FIG. 3.

Referring to FIG. 5, the lower conductive layer BML may include the first connection line CL1. The first connection line CL1 may be connected to the first gate conductive layer GL1 disposed on the lower conductive layer BML through a contact hole of the first connection electrode CDPC1.

The inorganic insulating layer IIL may include a lower insulating layer 112, a first gate insulating layer 113, a second gate insulating layer 114, a first interlayer insulating layer 115, a third gate insulating layer 116, and a second interlayer insulating layer 117. The inorganic insulating layer IIL may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO). The inorganic insulating layer IIL may include a groove GV surrounding the sub-pixel area PXA. The groove GV may be a region formed by removing all or a portion of the inorganic insulating layer IIL.

The lower insulating layer 112 may cover the lower conductive layer BML and be disposed on the buffer layer 111. The first semiconductor layer ACT1 may be disposed between the lower insulating layer 112 and the first gate insulating layer 113. The first semiconductor layer Act1 may include a silicon semiconductor. In an embodiment, the first semiconductor layer ACT1 may include the operation control channel region A6 of the operation control thin-film transistor T5.

The first gate conductive layer GL1 may be disposed on the first gate insulating layer 113. The first gate conductive layer GL1 may include the first electrode CE1 of the storage capacitor Cst, the first scan line SL1, and the emission control line EL. The first scan line SL1 or the emission control line EL may be connected to the first connection line CL1 of the lower conductive layer BML. The second gate insulating layer 114 may cover the first gate conductive layer GL1.

The second gate conductive layer GL2 may be disposed on the second gate insulating layer 114. The second gate conductive layer GL2 may include the second electrode CE2 of the storage capacitor Cst and the lower compensation gate electrode G3a. The first interlayer insulating layer 115 may cover the second gate conductive layer GL2.

The second semiconductor layer ACT2 may be disposed on the first interlayer insulating layer 115. The second semiconductor layer ACT2 may include an oxide semiconductor. In an embodiment, the second semiconductor layer ACT2 may include the compensation channel region A3, the compensation source region S3, and the compensation drain region D3.

In an embodiment, a region of the first scan line SL1 may be the third electrode CE3, and a region of the second semiconductor layer ACT2 may be the fourth electrode CE4. The third electrode CE3 and the fourth electrode CE4 may constitute the boost capacitor Cbt. The third gate insulating layer 116 may cover the second semiconductor layer ACT2.

The third gate conductive layer GL3 may be disposed on the third gate insulating layer 116. In an embodiment, the third gate conductive layer GL3 may include the upper compensation gate electrode G3b. The upper compensation gate electrode G3b may constitute the compensation gate electrode G3 in cooperation with the lower compensation gate electrode G3a. In other words, the compensation gate electrode G3 may include the lower compensation gate electrode G3a and the upper compensation gate electrode G3b. In this structure, the compensation thin-film transistor T3 may have a double-gate structure. In an embodiment, at least one of the lower compensation gate electrode G3a and the upper compensation gate electrode G3b may be omitted. In this structure, the compensation thin-film transistor T3 may have a single-gate structure. The second interlayer insulating layer 117 may cover the third gate conductive layer GL3.

The connection electrode layer CML may be disposed on the second interlayer insulating layer 117. The connection electrode layer CML may include the second conductive pattern CDP2, the third conductive pattern CDP3, the fourth conductive pattern CDP4, and the first connection electrode CDPC1. The second conductive pattern CDP2 may be connected to the compensation source region S3. The fourth conductive pattern CDP2 may connect the compensation drain region D3 to the emission control source region S6. The first connection electrode CDPC1 may connect the first gate conductive layer GL1 to the first connection line CL1 of the lower conductive layer BML.

In an embodiment, the connection electrode layer CML may be disposed on the inorganic insulating layer IIL. The inorganic insulating layer IIL may define the groove GV therein. The groove GV may surround the sub-pixel area PXA in a plan view. The groove GV may expose the lower conductive layer BML. When an external impact is applied, the groove GV may be configured to reduce the external impact transferred to the adjacent region.

In the case where various kinds of wirings included in the gate conductive layer GL and the first semiconductor layer ACT1 extend to pass across the groove GV in a plan view, there may be a danger of disconnection. In addition, in case of connecting various kinds of wirings of the gate conductive layer GL included in one sub-pixel area PXA and the first semiconductor layer ACT1 to another sub-pixel area PXA by using a new conductive layer, an additional process operation may be required.

In contrast, the display apparatus 1 according to an embodiment may be configured to connect signals between adjacent pixel areas PXA by using the gate conductive layer GL and the lower conductive layer BML below the first semiconductor layer ACT1. Accordingly, disconnection of various kinds of wirings may be prevented and process operations may be reduced. In addition, because the groove GV defined in the inorganic insulating layer IIL may be provided relatively deep, the display apparatus 1 may be robust and flexible against an external impact.

Hereinafter, description is made specifically with reference to FIG. 5.

The lower conductive layer BML may include the first connection line CL1. The first connection line CL1 may overlap the groove GV and be arranged to cross the groove GV in a plan view. The first connection line CL1 may overlap the first sub-pixel area PXA1 and the second sub-pixel area PXA2 in a plan view. The first gate conductive layer GL1 may be disposed on the lower conductive layer BML.

The first connection electrode CDPC1 disposed on the inorganic insulating layer IIL may be connected to the first connection line CL1 through a contact hole CNT1a and connected to the first gate conductive layer GL1 through another contact hole CNT1b. The first connection line CL1 may be connected to the emission control line EL or the first scan line SL1 of the first gate conductive layer GL1. Through this, signals of the emission control line EL or the first scan line SL1 may be connected to each other in the adjacent sub-pixel area PXA.

As an example, the emission control line EL included in the first sub-pixel area PXA1 is connected to the first connection line CL1 of the lower conductive layer BML through the contact holes CNT1a and CNT1b of the first connection electrode CDPC1 included in the first sub-pixel area PXA1. Likewise, the emission control line EL included in the second sub-pixel area PXA2 is connected to the first connection line CL1 of the lower conductive layer BML through the contact holes CNT1a and CNT1b of the first connection electrode CDPC1 included in the second sub-pixel area PXA2. Accordingly, a signal of the emission control line EL in the first sub-pixel area PXA1 may be transferred to the emission control line EL in the second sub-pixel area PXA2 through the first connection line CL1 of the lower conductive layer BML.

Figure 6:
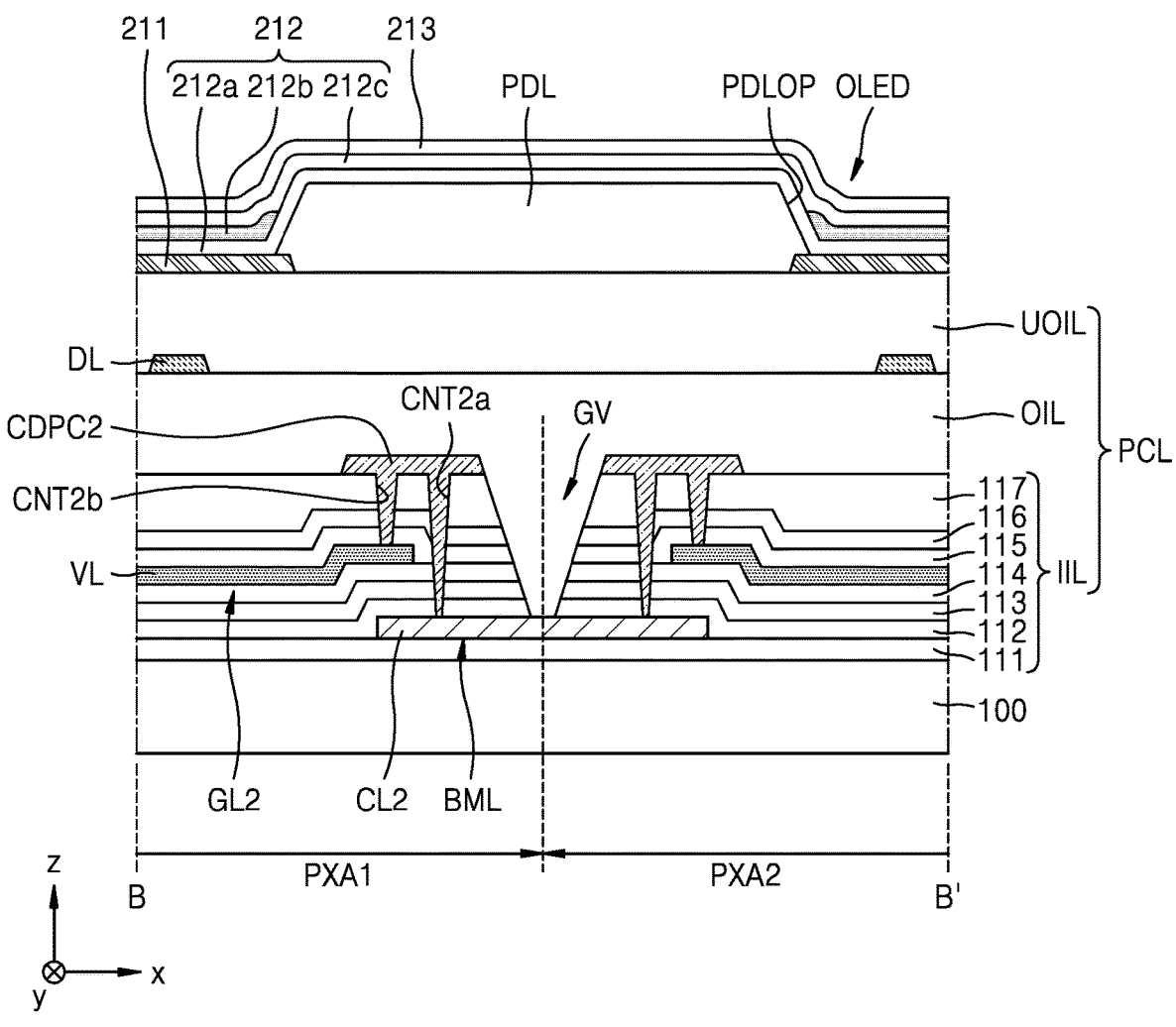

Referring to FIG. 6, the lower conductive layer BML may include the second connection line CL2. The second connection line CL2 may overlap the groove GV and be arranged to cross the groove GV in a plan view. The second connection line CL2 may overlap the first sub-pixel area PXA1 and the second sub-pixel area PXA2 in a plan view. The second gate conductive layer GL2 may be disposed on the lower conductive layer BML. The connection electrode layer CML may include the second connection electrode CDPC2.

The second connection electrode CDPC2 disposed on the inorganic insulating layer IL may be connected to the second connection line CL2 through a contact hole CNT2a and connected to the second gate conductive layer GL2 through another contact hole CNT2b. The second connection line CL2 may be connected to the initialization voltage line VL of the second gate conductive layer GL2, the lower previous scan line SLpa, or the second lower scan line SL2a.

Through this, signals of the initialization voltage line VL, the lower previous scan line SLpa, or the second lower scan line SL2a may be connected in the adjacent sub-pixel areas PXA.

As an example, the initialization voltage line VL included in the first sub-pixel area PXA1 is connected to the second connection line CL2 of the lower conductive layer BML through the contact holes CNT2a and CNT2b of the second connection electrode CDPC2 included in the first sub-pixel area PXA1. Likewise, the initialization voltage line VL included in the second sub-pixel area PXA2 is connected to the second connection line CL2 of the lower conductive layer BML through the contact holes CNT2a and CNT2b of the second connection electrode CDPC2 included in the second sub-pixel area PXA2. Accordingly, a signal of the initialization voltage line VL in the first sub-pixel area PXA1 may be transferred to the initialization voltage line VL in the second sub-pixel area PXA2 through the second connection line CL2 of the lower conductive layer BML.

Figure 7:
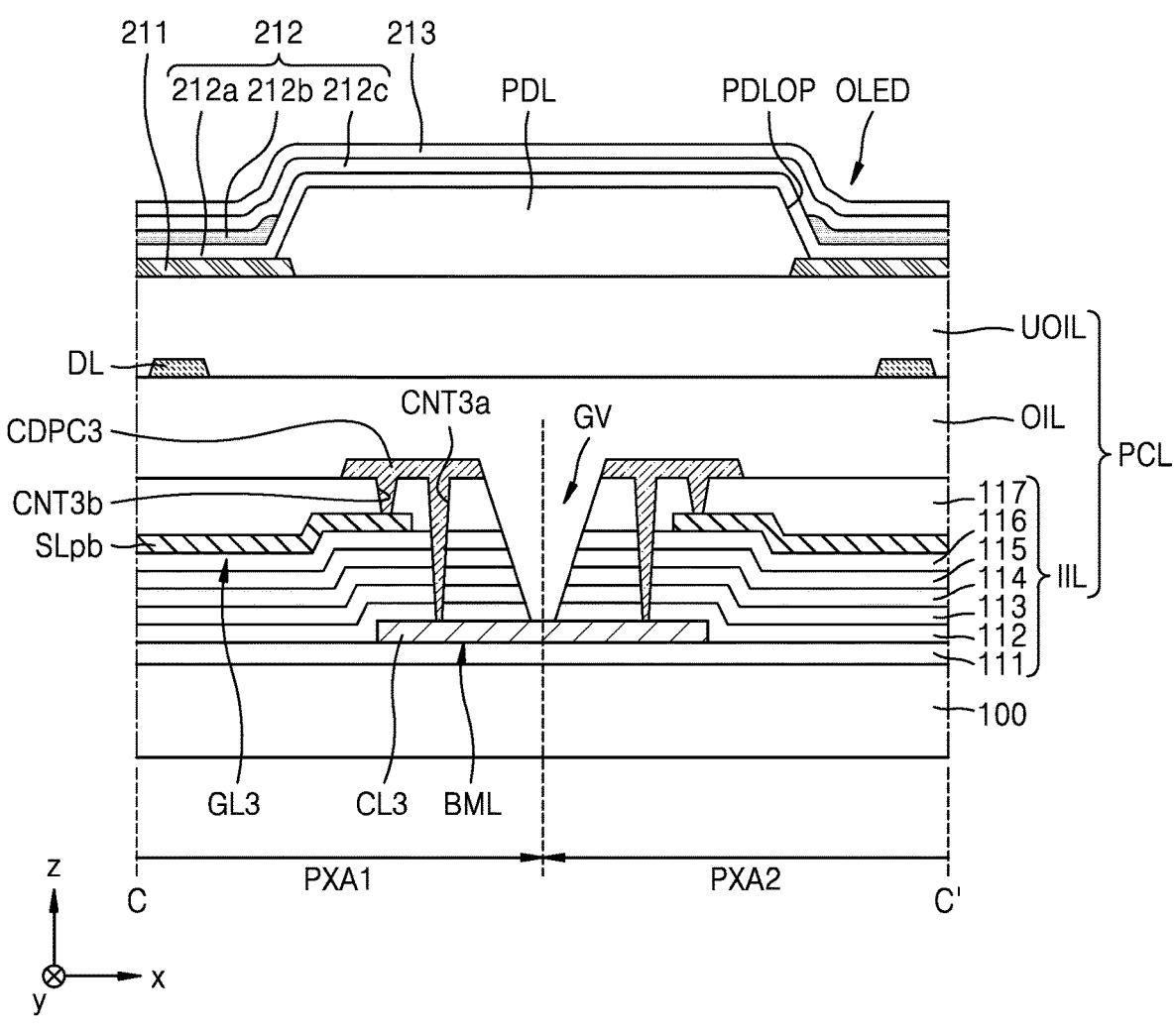

Referring to FIG. 7, the lower conductive layer BML may include the third connection line CL3. The third connection line CL3 may overlap the groove GV and be arranged to cross the groove GV in a plan view. The third connection line CL3 may overlap the first sub-pixel area PXA1 and the second sub-pixel area PXA2 in a plan view. The third gate conductive layer GL3 may be disposed on the lower conductive layer BML. The connection electrode layer CML may include the third connection electrode.

The third connection electrode CDPC3 disposed on the inorganic insulating layer IIL may be connected to the third connection line CL3 through a contact hole CNT3a and connected to the third gate conductive layer GL3 through another contact hole CNT3b. The third connection line CL3 may be connected to the upper previous scan line SLpb or the second upper scan line SL2b of the third gate conductive layer GL3.

Through this, signals of the upper previous scan line SLpb or the second upper scan line SL2b may be connected to each other in the adjacent sub-pixel area PXA.

As an example, the upper previous scan line SLpb included in the first sub-pixel area PXA1 is connected to the third connection line CL3 of the lower conductive layer BML through the contact holes CNT3a and CNT3b of the third connection electrode CDPC3 included in the first sub-pixel area PXA1. Likewise, the upper previous scan line SLpb included in the second sub-pixel area PXA2 is connected to the third connection line CL3 of the lower conductive layer BML through the contact holes CNT3a and CNT3b of the third connection electrode CDPC3 included in the second sub-pixel area PXA2. Accordingly, a signal of the upper previous scan line SLpb in the first sub-pixel area PXA1 may be transferred to the upper previous scan line SLpb in the second sub-pixel area PXA2 through the third connection line CL3 of the lower conductive layer BML.

Referring to FIG. 8, the lower conductive layer BML may include the fourth connection line CL4. The fourth connection line CL4 may overlap the groove GV and be arranged to cross the groove GV in a plan view. The fourth connection line CL4 may overlap the first sub-pixel area PXA1 and the third sub-pixel area PXA3 in a plan view. The first semiconductor layer ACT1 may be disposed on the lower conductive layer BML. The connection electrode layer CML may include the fourth connection electrode CDPC4.

The fourth connection electrode CDPC4 disposed on the inorganic insulating layer IIL may be connected to the fourth connection line CL4 through a contact hole CNT4a and connected to the first semiconductor layer ACT1 through another contact hole CNT4b. Through this, the first semiconductor layers ACT1 may be connected to each other in the adjacent sub-pixel areas PXA.

As an example, the first semiconductor layer ACT1 included in the first sub-pixel area PXA1 is connected to the fourth connection line CL4 of the lower conductive layer BML through the contact holes CNT4a and CNT4b of the fourth connection electrode CDPC4 included in the first sub-pixel area PXA1. Likewise, the first semiconductor layer ACT1 included in the third sub-pixel area PXA3 is connected to the fourth connection line CL4 of the lower conductive layer BML through the contact holes CNT4a and CNT4b of the fourth connection electrode CDPC4 included in the third sub-pixel area PXA3. That is, the first semiconductor layer ACT1 in the first sub-pixel area PXA1 may be connected to the first semiconductor layer ACT1 in the third sub-pixel area PXA3 through the fourth connection line CL4 of the lower conductive layer BML.

Referring to FIGS. 5 to 8, in an embodiment, the groove GV defined by the inorganic insulating layer IIL may expose the lower conductive layer BML. In another embodiment, the groove GV may expose a portion of the inorganic insulating layer IIL disposed on the lower conductive layer BML.

The organic insulating layer OIL may be disposed on the connection electrode layer CML and the inorganic insulating layer K. The organic insulating layer OIL may fill the groove GV defined in the inorganic insulating layer IL.

The upper connection electrode layer UCML may be disposed on the organic insulating layer OIL. The upper connection electrode layer UCML may include the data line DL and the upper conductive pattern UCDP. An upper organic insulating layer UOIL may cover the upper conductive pattern UCDP.

The display element layer DEL may be disposed on the pixel circuit layer PCL. The display element layer DEL may include the organic light-emitting diode OLED as a display element electrically connected to the pixel circuit PC. The organic light-emitting diode OLED may include a pixel electrode 211, an intermediate layer 212, and an opposite electrode 213.

The pixel electrode 211 may be connected to the upper conductive pattern UCDP through a contact hole of the upper organic insulating layer UOIL. Accordingly, the organic light-emitting diode OLED may be electrically connected to the pixel circuit PC.

The pixel electrode 211 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 211 may further include a layer on/under the reflective layer, the layer including ITO, IZO, ZnO, or $In_2O_3$.

A pixel-defining layer PDL may be disposed on the pixel electrode 211, where the pixel-defining layer PDL defines an opening PDLOP therein exposing the central portion of the pixel electrode 211. The pixel-defining layer PDL may include an organic insulating material and/or an inorganic insulating material. The opening PDLOP may define the emission area of light emitted from the organic light-emitting diode OLED. As an example, the width of the opening PDLOP may correspond to the width of the emission area.

The intermediate layer 212 may be disposed on the pixel-defining layer PDL and the pixel electrode 211. The intermediate layer 212 may include an emission layer 212b disposed in the opening PDLOP defined in the pixel-defining layer 118. The emission layer 212b may include a polymer or low-molecular weight organic material emitting light of a preset color.

A first functional layer 212a and a second functional layer 212c may be disposed under and on the emission layer 212b, respectively. The first functional layer 212a may include, for example, a hole transport layer ("HTL"), or include an HTL and a hole injection layer ("HU"). The second functional layer 212c is an element disposed on the emission layer 212b and may be optional. The second functional layer 212c may include an electron transport layer ("ETU") and/or an electron injection layer ("EIL"). Like the opposite electrode 213 described below, the first functional layer 212a and/or the second functional layer 212c may be common layers covering the substrate 100 entirely.

The opposite electrode 213 may be disposed on the intermediate layer 212. The opposite electrode 213 may include a conductive material having a low work function. As an example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. Alternatively, the opposite electrode 213 may further include a layer on the (semi) transparent layer, the layer including ITO, IZO, ZnO, or $In_2O_3$.

In an embodiment, a capping layer (not shown) may be further arranged on the opposite electrode 213. The capping layer may include lithium fluoride (LiF), an inorganic material, and/or an organic material. In an embodiment, an encapsulation layer configured to encapsulate the organic light-emitting diode OLED on the opposite electrode 213 may be further provided.

According to an embodiment, a high-resolution display apparatus which may be flexible and robust against an external impact may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate including a sub-pixel area;
   a lower conductive layer disposed on the substrate and including a connection line;
   a first semiconductor layer disposed on the lower conductive layer;
   a gate conductive layer disposed on the lower conductive layer and connected to the connection line;
   an inorganic insulating layer disposed on the substrate and defining a groove therein surrounding the sub-pixel area; and
   a connection electrode layer disposed on the inorganic insulating layer and connected to the gate conductive layer,
   wherein the connection line is disposed to cross the groove in a plan view.

2. The display apparatus of claim 1, wherein the sub-pixel area includes a first sub-pixel area and a second sub-pixel area each surrounded by the groove, and
   the connection line overlaps the first sub-pixel area and the second sub-pixel area in the plan view.

3. The display apparatus of claim 1, further comprising a second semiconductor layer disposed on the first semiconductor layer,
   wherein the gate conductive layer includes a first gate conductive layer, a second gate conductive layer, and a third gate conductive layer,
   the first gate conductive layer and the second gate conductive layer are disposed between the first semiconductive layer and the second semiconductive layer, and
   the third gate conductive layer is disposed on the second semiconductor layer.

4. The display apparatus of claim 3, wherein the connection line is provided in plurality,
   the plurality of connection lines includes a first connection line, a second connection line, and a third connection line,
   the first connection line is electrically connected to the first gate conductive layer,
   the second connection line is electrically connected to the second gate conductive layer, and the third connection line is electrically connected to the third gate conductive layer.

5. The display apparatus of claim 4, wherein the plurality of connection lines further includes a fourth connection line electrically connected to the first semiconductor layer.

6. The display apparatus of claim 5, wherein the first connection line, the second connection line, and the third connection line extend in a first direction, and
   the fourth connection line extends in a second direction crossing the first direction.

7. The display apparatus of claim 4, wherein the first semiconductor layer includes a silicon semiconductor, and
   the second semiconductor layer includes an oxide semiconductor.

8. The display apparatus of claim 1, wherein the groove exposes a portion of the lower conductive layer.

9. The display apparatus of claim 1, further comprising an organic insulating layer covering the inorganic insulating layer and the connection electrode layer,
   wherein the organic insulating layer is disposed to fill the groove.

10. The display apparatus of claim 9, further comprising:
    a pixel electrode disposed on the organic insulating layer;
    an intermediate layer disposed on the pixel electrode; and
    an opposite electrode covering the intermediate layer.

11. A display apparatus comprising:
    a substrate including a sub-pixel area;
    a lower conductive layer disposed on the substrate;
    a first semiconductor layer disposed on the lower conductive layer and including a silicon semiconductor;
    a first gate conductive layer disposed on the first semiconductor layer;
    an inorganic insulating layer disposed on the substrate and defining a groove therein surrounding the sub-pixel area; and
    a first connection electrode disposed on the inorganic insulating layer and connecting the lower conductive layer to the first gate conductive layer through a contact hole,
    wherein the lower conductive layer includes a plurality of connection lines overlapping the groove in a plan view.

12. The display apparatus of claim 11, further comprising:
    a second gate conductive layer disposed on the first gate conductive layer;
    a third gate conductive layer disposed on the second gate conductive layer; and
    a second semiconductor layer disposed between the second gate conductive layer and the third gate conductive layer and including an oxide semiconductor,
    wherein the plurality of connection lines includes a first connection line, a second connection line, and a third connection line,
    the first connection line is electrically connected to the first gate conductive layer,
    the second connection line is electrically connected to the second gate conductive layer, and
    the third connection line is electrically connected to the third gate conductive layer.

13. The display apparatus of claim 12, further comprising:
    a second connection electrode disposed on the inorganic insulating layer and connecting the second gate conductive layer to the second connection line through a contact hole; and
    a third connection electrode disposed on the inorganic insulating layer and connecting the third gate conductive layer to the third connection line through a contact hole.

14. The display apparatus of claim 13, wherein the plurality of connection lines further includes a fourth connection line electrically connected to the first semiconductor layer, and the display apparatus further includes a fourth connection electrode disposed on the inorganic insulating layer and connecting the first semiconductor layer to the fourth connection line through a contact hole.

15. The display apparatus of claim 11, wherein the plurality of connection lines is disposed to cross the groove in the plan view.

16. The display apparatus of claim 11, wherein the sub-pixel area includes a first sub-pixel area and a second sub-pixel area, and the groove surrounds each of the first sub-pixel area and the second sub-pixel area and exposes a portion of the lower conductive layer in the plan view.

17. The display apparatus of claim 11, further comprising:

an organic insulating layer covering the inorganic insulating layer and filling the groove;

an upper connection electrode layer disposed on the organic insulating layer; and an upper organic insulating layer covering the upper connection electrode layer.

18. The display apparatus of claim 17, further comprising a pixel electrode disposed on the upper organic insulating layer and connected to the upper connection electrode layer.

19. The display apparatus of claim 18, further comprising:

an intermediate layer disposed on the pixel electrode; and an opposite electrode covering the intermediate layer.

\* \* \* \* \*